US010755001B2

(12) United States Patent
Shakeri et al.

(10) Patent No.: US 10,755,001 B2
(45) Date of Patent: Aug. 25, 2020

(54) PORT MANAGEMENT FOR GRAPHICAL MODELING

(71) Applicant: The Mathworks, Inc., Natick, MA (US)

(72) Inventors: Mojdeh Shakeri, Southborough, MA (US); Tao Cheng, Brighton, MA (US); Robert O. Aberg, Grafton, MA (US); Michael D. Tocci, Franklin, MA (US); Jamieson M. Cobleigh, Ashland, MA (US); Haihua Feng, Sherborn, MA (US); Kaushik Krishnasamy, Ashland, MA (US)

(73) Assignee: The MathWorks, Inc., Natick, MA (US)

( * ) Notice: Subject to any disclaimer, the term of this patent is extended or adjusted under 35 U.S.C. 154(b) by 807 days.

(21) Appl. No.: 15/298,019

(22) Filed: Oct. 19, 2016

(65) Prior Publication Data

US 2017/0154137 A1   Jun. 1, 2017

Related U.S. Application Data

(60) Provisional application No. 62/260,776, filed on Nov. 30, 2015.

(51) Int. Cl.
*G06F 30/18* (2020.01)
*G06F 8/10* (2018.01)
*G06F 8/34* (2018.01)
*G06F 9/54* (2006.01)
*G06F 8/36* (2018.01)

(52) U.S. Cl.
CPC ............... *G06F 30/18* (2020.01); *G06F 8/10* (2013.01); *G06F 8/34* (2013.01); *G06F 9/541* (2013.01); *G06F 8/36* (2013.01)

(58) Field of Classification Search
CPC ..... G06F 30/18; G06F 8/10; G06F 8/34; G06F 9/541; G06F 8/36
USPC .............................................. 703/6
See application file for complete search history.

(56) References Cited

U.S. PATENT DOCUMENTS 8,620,629 B1 * 12/2013 Li ................. G06F 17/5009
703/1
2005/0096894 A1 * 5/2005 Szpak ............. G06F 17/5009
703/13

OTHER PUBLICATIONS

The MathWorks, "Using Simulink Version 6", Sep. 2005, 711 pages. (Year: 2005).*
Clune et al. "Discrete Event and Hybrid System Simulation with SimEvents", Jan. 2006, 2 pages. (Year: 2006).*
van Schijndel, Jos. "A review of the application of SimuLink S-functions to multi domain modelling and building simulation", May 2014, 43 pages. (Year: 2014).*

(Continued)

*Primary Examiner* — Suzanne Lo
(74) *Attorney, Agent, or Firm* — Young Basile Hanlon & MacFarlane, P.C.

(57) ABSTRACT

A device may detect a user interaction, via a user interface, with a particular component of a model. The device may generate a set of components, associated with the particular component, based on detecting the user interaction with the particular component of the model. The device may cause a representation of the set of components to be provided, via the user interface, in association with the model. The representation may indicate that the set of components are associated with permitting interoperability.

54 Claims, 19 Drawing Sheets

(56) References Cited

OTHER PUBLICATIONS

Tutorialspoint, "UML 2.0—Overview," https://www.tutorialspoint.com/uml/uml_2_overview.htm, Feb. 20, 2009, 7 pages.

Wikipedia, "Composite structure diagram," https://en.wikipedia.org/wiki/Composite_structure_diagram, May 15, 2016, 2 pages.

University of Texas, "Polymorphism," http://www.cs.utexas.edu/~mitra/csSummre2012/cs312/lectures/intefaces.html, Nov. 26, 2003, 2 pages.

Long et al., co-pending U.S. Appl. No. 14/635,719, entitled "Exchanging Information Among System Middlewares and Models", filed Mar. 2, 2015, 64 pages.

Ulusoy et al., co-pending U.S. Appl. No. 15/060,019, entitled "Automatic Grouping of Signals of a Model", filed Mar. 3, 2016, 72 pages.

OMG: Object Management Group, "Common Object Request Broker Architecture (CORBA)," http://www.omg.org/spec/CORBA/3.3/, Nov. 12, 2012, 532 pages.

FORWARDSIM: simulations & technologies, "HLA Blockset: The Simulink interface to HLA," Mar. 2014, 2 pages.

OMG: Object Management Group, "Data Distribution Service for Real-time Systems," Jul., 1, 2001, 260 pages/.

OSGi Alliance, "The OSGi Architecture," http://www.osgi.org/Technology/WhatIsOSGi, Aug. 13, 2008, 4 pages.

Xiong et al., "HLA Based Collaborative Simulation with MATLAB Seamlessly Embedded," International Journal of Machine Learning and Computing, vol. 2, No. 2, Apr. 2012, 8 pages.

Notification of Transmittal of the International Search Report and the Written Opinion of the International Searching Authority, or the Declaration, corresponding to PCT/US2016/064098, dated May 18, 2017, pp. 1-16.

The Mathworks: "Simulink Model-Based and System-Based Design—Using Simulink Version 5", Oct. 5, 2014, XP002410179, pp. 4-48.

\* cited by examiner

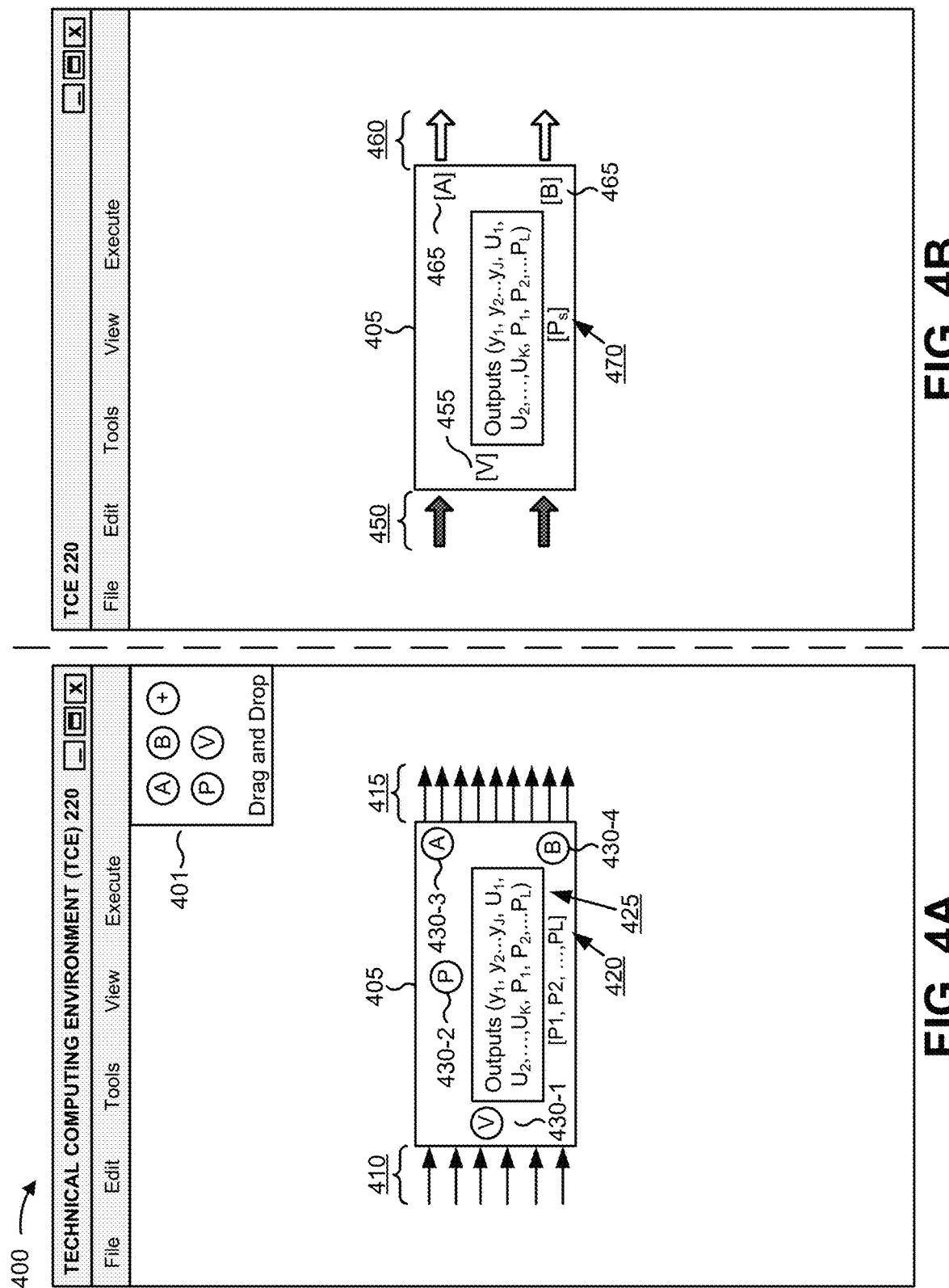

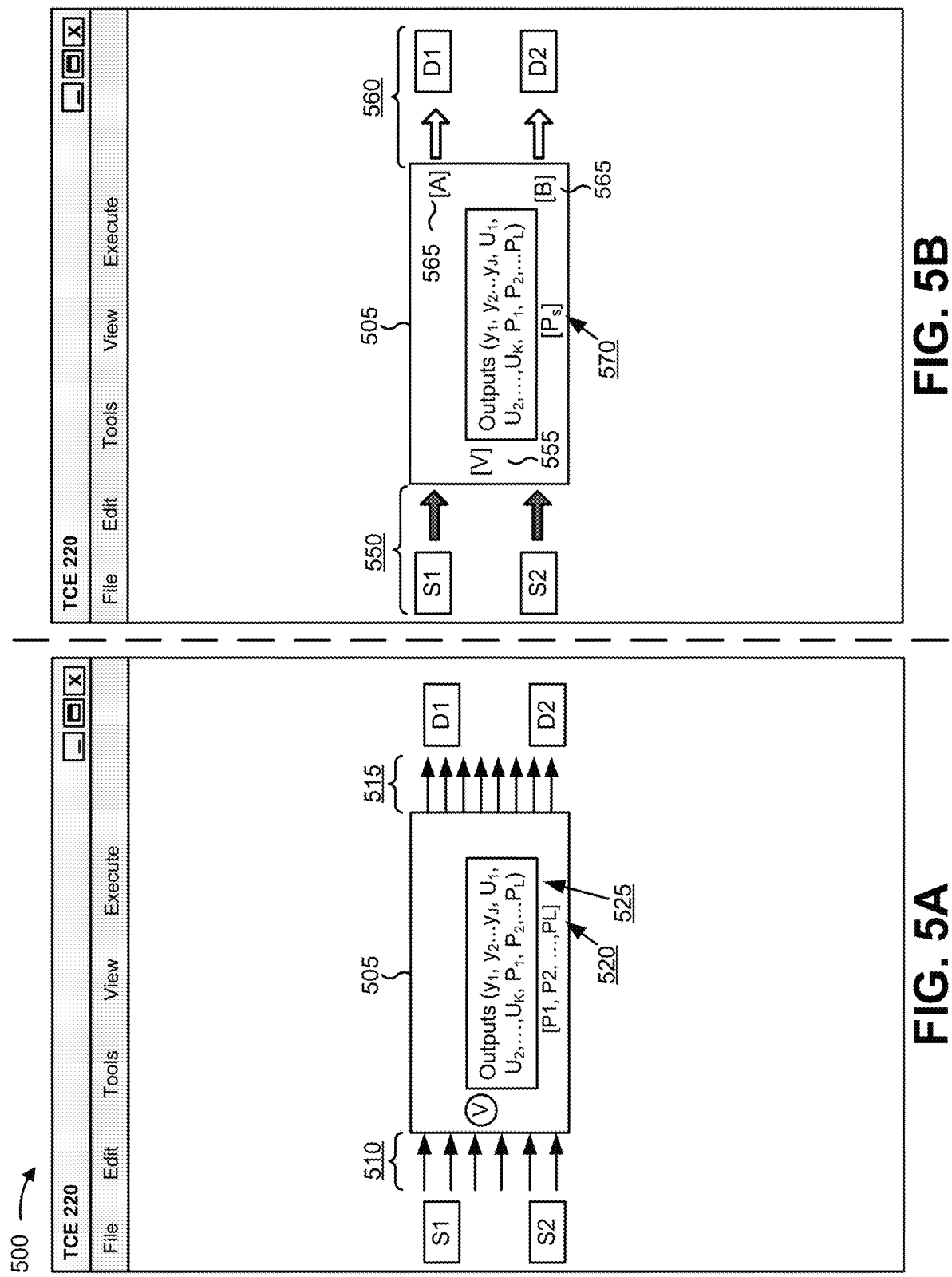

FIG. 10A

TCE 220

File    Edit    Tools    View    Execute

Design Specification:
- TopBus
  - A: Scalar
  - B: Tie wrap (virtual bus)
    - Q
    - R
  - C: Structure (non-virtual bus)
    - S
    - T

⎫ 1110

```
A = Simulink.Signal;
Q = Simulink.Signal;
R = Simulink.Signal;
```
⎫ 1130

```
B = map({'Q', Q}, {'R', R});
```
⎫ 1140

```
C = Simulink.Signal;
C.DataType = 'Bus:busObject';
C.CoderInfo.StorageClass = 'ExportedGlobal';
```
⎫ 1150

```
TopBus = map({'A',A},{'B',B},{'C',C});
```
⎫ 1160

PORT MANAGEMENT FOR GRAPHICAL MODELING

RELATED APPLICATION(S)

This application claims priority under 35 U.S.C. § 119 to U.S. Provisional Patent Application No. 62/260,776, filed on Nov. 30, 2016, the content of which is incorporated by reference herein in its entirety.

BRIEF DESCRIPTION OF THE DRAWINGS

FIGS. 4A and 4B are diagrams of an example implementation of interface adaptation;

FIGS. 5A and 5B are diagrams of another example implementation of interface adaptation;

FIGS. 10A-10D are diagrams of another example implementation of interface adaptation; and FIG. 11 is a diagram of another example implementation of interface adaptation.

DETAILED DESCRIPTION

The following detailed description of example implementations refers to the accompanying drawings. The same reference numbers in different drawings may identify the same or similar elements.

A graphical model may include a set of components. A component may include a model element, a textual element, or the like. A model element may include a block diagram block, a port, a subsystem, a connection, a function, or the like. Similarly, a textual element may include a portion of program code, a function, or the like. Information (e.g., a signal) may be transferred between portions of the graphical model. For example, a signal may be provided from an output port of a first block to an input port of a second block. However, the signal output from the output port of the first block may be incompatible with a type of signal that the input port of the second block is configured to receive. For example, the output port may be associated with providing a signal with a first set of signal attributes, such as a first dimension, a first data type, a first sample rate, or the like. Further to the example, the input port may be associated with receiving a signal associated with a second set of signal attributes, such as a second dimension, a second data type, a second sample rate, or the like. In this case, the first set of signal attributes and the second set of signal attributes may be different, preventing communication between the output port and the input port.

Implementations, described herein, may provide an interface adapter to permit communication between incompatible portions of a graphical model, such as between multiple connecting graphical blocks, between a graphical block and an executable, or the like. For example, a server device may generate a port expansion layer including a set of components associated with adapting a port to receive a particular input or provide a particular output. In this way, the server device may improve graphical modeling by automatically ensuring compatibility between components of a graphical model, such as graphically connected components, hierarchically connected components, or the like.

Figure 1B:
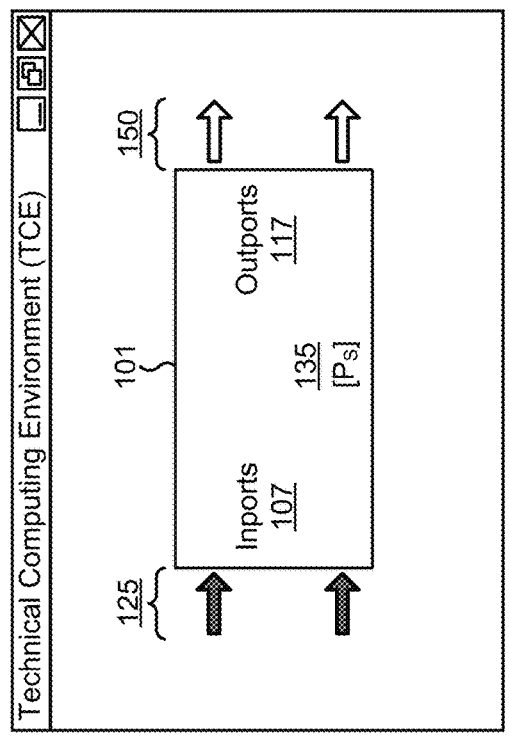
FIGS. 1A and 1B are diagrams of an overview of an example implementation described herein.
Figure 1A:
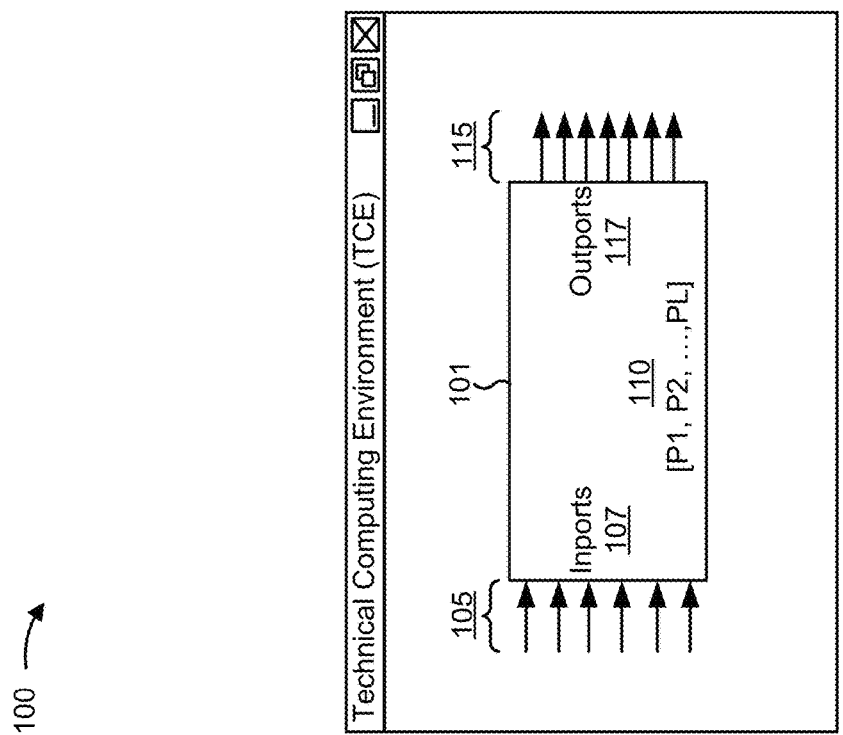

FIGS. 1A and 1B are diagrams of an overview of an example implementation 100 described herein. As shown in FIG. 1A, example implementation 100 may include a technical computing environment (TCE). The TCE may be provided via a user interface of a client device. The TCE may include a block 101 connected to one or more source blocks that are associated with providing a set of signals 105. Block 101 may be associated with a set of input ports (e.g., "inports") 107 for receiving signals. Block 101 may be associated with a set of parameters 110 (e.g., parameters "P1, P2, ..., $P_L$") of a parent subsystem. Block 101 may be connected to one or more destination blocks that are associated with receiving a set of signals 115. Block 101 may be associated with a set of output ports (e.g., "outports") 117 for providing the signals.

The client device may configure an interface adapter to permit block 101 to receive signals 105 via inports 107. Assume that one or more signal attributes of signals 105 are incompatible with one or more signal attributes of signals that inports 107 are configured to receive. For example, a first source block may output 4 signals of signals 105 and a second source block may output 2 signals of signals 105. In this case, inports 107 may be configured to receive 2 groups of signals via 2 inports, rather than the 6 separate signals provided by the first source block and the second source block. The client device may configure the interface adapter to cause the 6 signals of signals 105 to be partitioned for receipt by block 101. Partitioning the 6 signals into groups may include generating a set of components associated with grouping and/or altering the 6 signals. As an example, the client device may group the first 4 signals into a first vector to be received by a first inport of inports 107. Further to the example, the client device may configure the interface adapter to cause the second 2 signals to be grouped into a second vector to be received by a second inport of inports 107. In this way, the client device causes signals 105 to be receivable by inports 107.

The client device may configure the interface adapter to group parameters 110 of block 101 into a structure parameter associated with a parent system. In other words, block 101 is a subsystem of a parent system that includes a structure parameter corresponding to parameters 110. A structure parameter may refer to a parameter that includes multiple numeric variables as fields. For example, the client device may group "$P_1, P_2, \ldots, P_L$" into a particular structure parameter "$P_S$." In this way, the client device adapts a presentation of parameters of block 101 (e.g., a graphical presentation, a textual presentation, etc.) to map to a parent system, thereby providing improved clarity in understanding the graphical model.

The client device may configure the interface layer to permit block 101 to provide signals 115 via outports 117. Assume that one or more signal attributes of signals 115 are not providable by outports 117 (e.g., a type of signal that outports 117 are configured to provide is not the type of signal that the one or more destination blocks are configured to receive). For example, a first destination block may be associated with receiving a first vector including a first structure signal including 5 signals of signals 115 and a second destination block may be associated with receiving a second vector including a second structure signal including 2 signals of signals 115. The client device may package signals 115 into the first structure signal and the second structure signal. Packaging signals 115 may include generating a set of components associated with packaging and/or grouping signals 115.

Assume that the client device represents the interface adapter, graphically, as a set of layers that alter a presentation of block 101. The interface adapter may generate a mediation layer associated with the TCE that performs one or more data conversions associated with permitting interoperability between non-compatible portions of a model (e.g., non-compatible blocks or the like). However, the client device may selectively provide information representing the mediation layer. For example, the client device may alter an appearance of block 101 and/or signals associated therewith to identify an effect of the interface layer in causing interoperability. In this case, the client device may represent signals 105 as being packaged or grouped. Additionally, or alternatively, the client device may alter an appearance of block 101 to provide information identifying components associated with packaging or grouping, such as bus components, internal inputs, internal outputs, or the like.

As shown in FIG. 1B, the client device provides a graphical representation of block 101 after configuring the interface adapter. As shown by reference number 125, signals 105 are partitioned into a first group of signals received via inports 107 and a second group of signals received via inports 107. As shown by reference number 135, parameters 110 are represented as grouped into structure parameter 135 (e.g., "[$P_S$]"). As shown by reference number 150, the client device provides a representation of the first structure signal and the second structure signal. The client device provides a representation of signals 115 being provided by block 101 and outports 117 as the first structure signal and the second structure signal.

In this way, the client device corrects an interoperability issue associated with a component by configuring an interface adapter that adapts an output interface of a first portion of the graphical model to an input interface of a second portion of the graphical model. In this way, the client device permits multiple incompatible portions of a graphical model, a text-based model, or the like to be compatible. Moreover, the client device may provide a layered view of the interface adapter by providing different representations of the interface adapter with different associated granularities.

Figure 2:
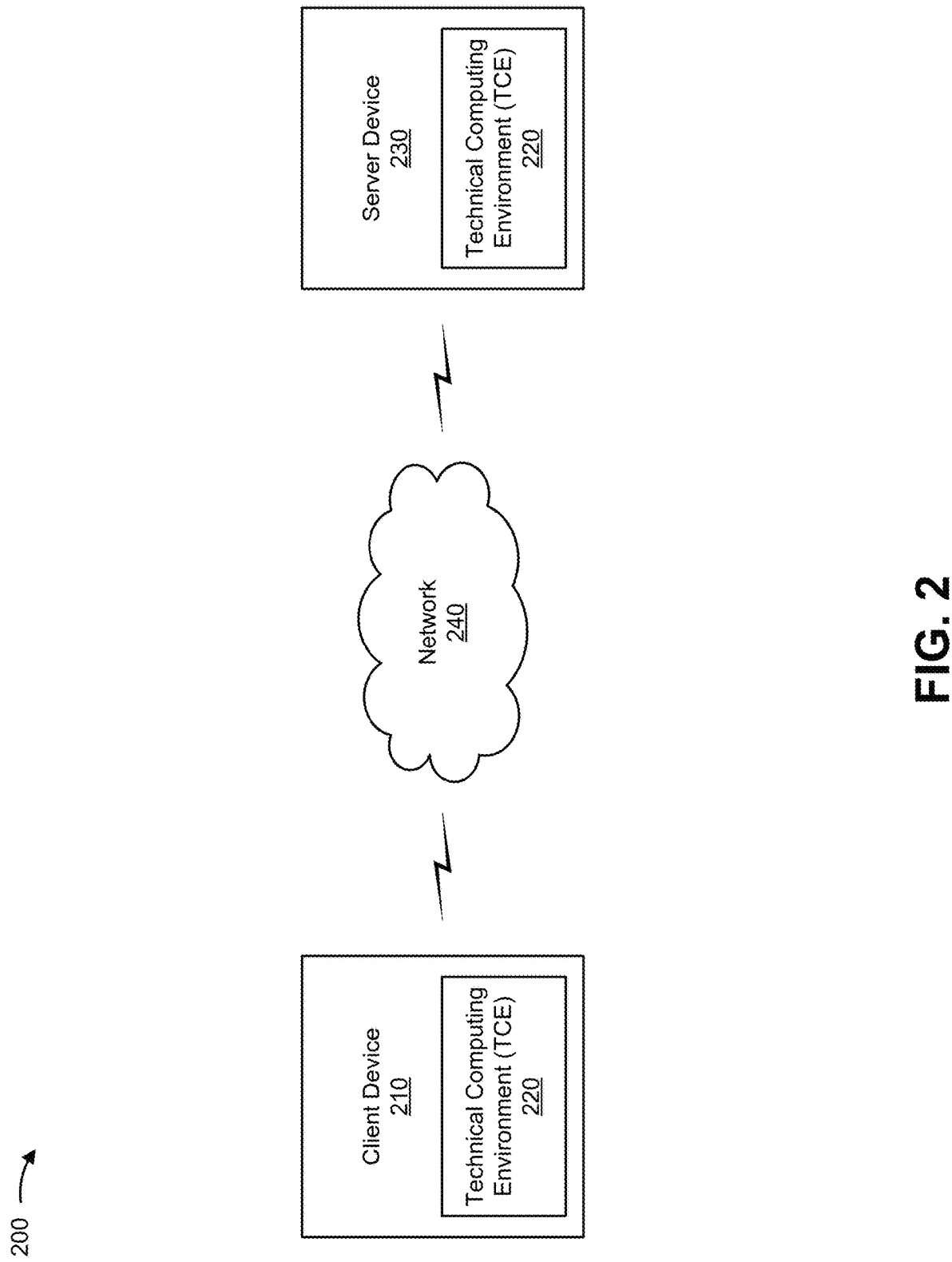
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a client device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

Client device 210 may include one or more devices capable of receiving, generating, storing, processing, and/or providing information associated with an interface adapter. For example, client device 210 may include a computing device, such as a desktop computer, a laptop computer, a tablet computer, a mobile phone (e.g., a smart phone, a radiotelephone, etc.), or a similar device. Client device 210 may obtain a model (e.g., a graphical model), and may configure an interface adapter to permit portions of the model (e.g., blocks, textual elements, etc.) to exchange information. In some implementations, client device 210 may receive information from and/or transmit information to server device 230.

Client device 210 may host TCE 220. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB® software by The MathWorks, Inc.; Octave; Python; JavaScript; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dassault Systemes; etc.), a graphically-based environment (e.g., Simulink® software, Stateflow® software, SimEvents® software, Simscape™ software etc., by The MathWorks, Inc.; VisSim by Visual Solutions; LabView® by National Instruments; Agilent VEE by Agilent Technologies; Advanced Design System (ADS) by Agilent Technologies; Agilent Ptolemy by Agilent Technologies; etc.), or another type of environment, such as a hybrid environment that may include, for example, a text-based environment and a graphically-based environment. In some implementations, TCE 220 may include, for example, a user interface and/or enable simulation and execution of hardware and/or software systems. In some implementations, TCE 220 may include a high-level architecture (HLA) that facilitates performing a simulation, such as performing a distributed simulation.

TCE 220 may be integrated with or operate in conjunction with a modeling environment, which may provide graphical tools for constructing models (e.g., graphical models) of systems and/or processes. TCE 220 may include additional tools, such as tools designed to convert a model into an alternate representation, such as an alternate model format, code or a portion of code representing source computer code and/or compiled computer code, a hardware description (e.g., a specification of a digital circuit, a description of a circuit layout, etc.), or the like. TCE 220 may also include tools to convert a model into project files for use in an integrated development environment (IDE) such as Eclipse by Eclipse Foundation, IntelliJ IDEA by JetBrains or Visual Studio by Microsoft. A model (e.g., a graphical model) may include one or more model elements that simulate characteristics of a system and/or a process. Each model element may be associated with a graphical representation thereof that may include a set of objects, such as one or more blocks (e.g., block diagram blocks), ports, connector lines, or the like.

Server device 230 may include one or more devices capable of receiving, generating, storing, processing, and/or providing information associated with an interface adapter. For example, server device 230 may include a computing device, such as a server, a desktop computer, a laptop computer, a tablet computer, or a similar device. In some implementations, server device 230 may host TCE 220. In some implementations, client device 210 may be used to access one or more TCEs 220 running on one or more server devices 230. For example, multiple server devices 230 may be used to execute program code (e.g., serially or in parallel), and may provide respective results of executing the program code to client device 210.

In some implementations, client device 210 and server device 230 may be owned by different entities. For example, an end user may own client device 210, and a third party may own server device 230. In some implementations, server device 230 may include a device operating in a cloud computing environment. In this way, front-end applications (e.g., a user interface) may be separated from back-end applications (e.g., program code execution). Additionally, or alternatively, server device 230 may perform one, more, or all operations described elsewhere herein as being performed by client device 210.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
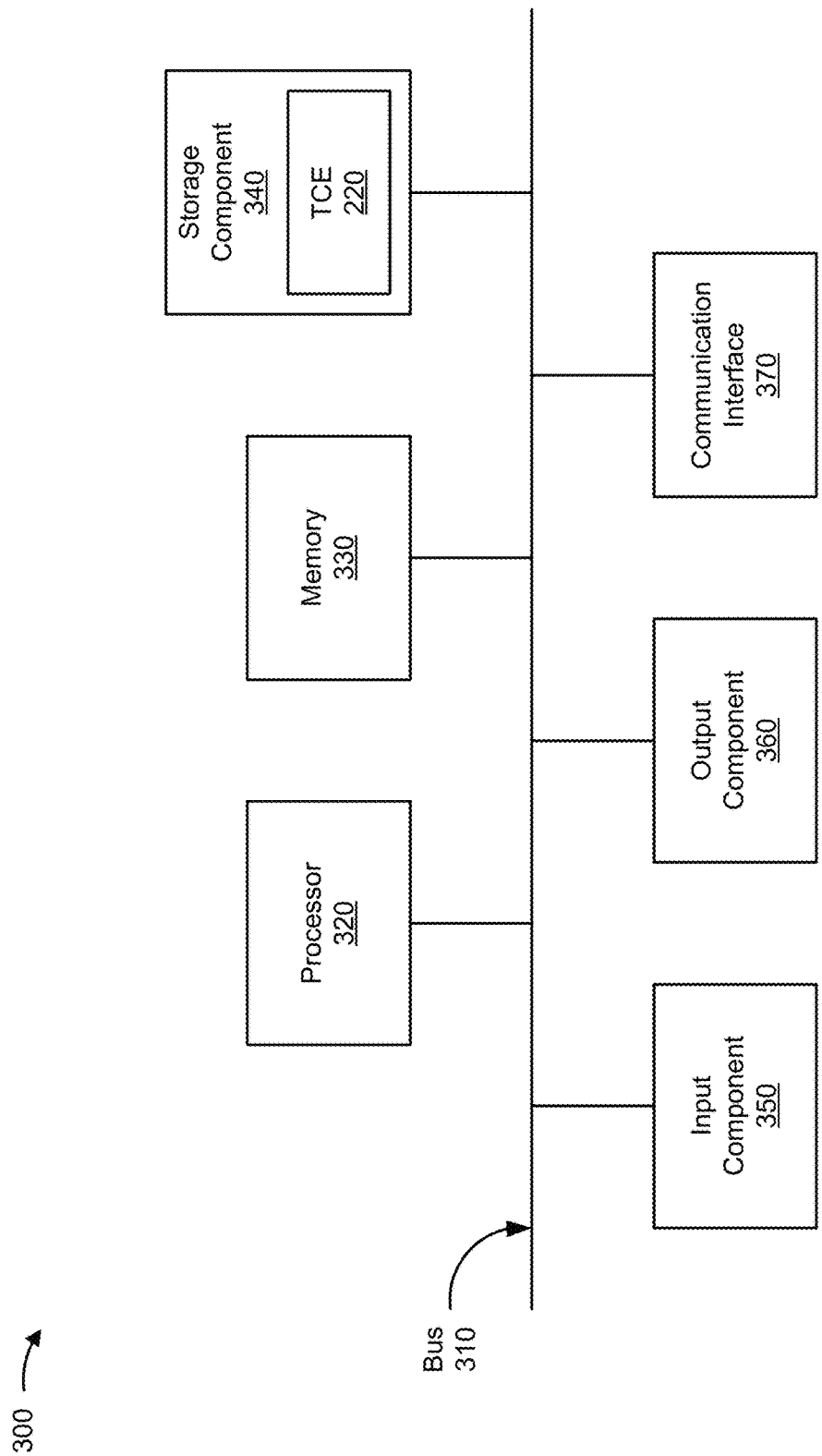
FIG. 3 is a diagram of example components of one or more devices of FIG. 2.

FIG. 3 is a diagram of example components of a device 300. Device 300 may correspond to client device 210 and/or server device 230. In some implementations, client device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 is implemented in hardware, firmware, or a combination of hardware and software. Processor 320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions. In some implementations, processor 320 may include one or more processors that can be programmed to perform a function. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIGS. 4A and 4B are diagrams of an example implementation 400 of interface adaptation.

With regard to FIG. 4A, client device 210 may provide, via a user interface of TCE 220, a user interface element 401 to provide a drag-and-drop functionality to configure an interface adapter. Block 405 may be established in a graphical model to receive input signals 410 (e.g., 6 signals) from a set of source blocks and to provide output signals 415 (e.g., 9 signals) to a set of destination blocks. Block 405 may include a set of parameters 420 (e.g., "$P_1, P_2, \ldots, P_L$"). As shown by reference number 425, block 405 may include a graphical representation of a textual element (e.g., program code). Client device 210 may parse the program code representation of block 405 to determine one or more information groupings when receiving an instruction relating to configuring the interface adapter.

As further shown in FIG. 4A, and by reference number 430-1, client device 210 may receive, via a user interface, an interaction causing client device 210 to position an indicator, 'V,' in association with an input portion of block 405. The interaction may include a drag-and-drop instruction, a point-and-click instruction, or the like. Assume that V identifies a [4 2] vector variable. Attributes of the vector may be specified via another user interface module (e.g., a pop-up menu), may be automatically determined (e.g., by parsing the program code), or the like. Client device 210 may group input signals 410 into a first input vector of 4 signals and a second input vector of 2 signals, thereby configuring the interface adapter for input signals 410. Client device 210 may select the 4 signals of input signals 410 for the first vector and the 2 signals of input signals 410 for the second vector. Client device 210 may select the signals based on a set of selection criteria, such as based on the program code representation of block 405. In another example, client device 210 may select the signals based on an order of the signals, such as a graphical order (e.g., top-to-bottom order of input signals 410), a descriptive order (e.g., an alphabetical order of names of input signals 410), or the like.

As further shown in FIG. 4A, and by reference number 430-2, client device 210 may receive, via a user interface, an interaction causing client device 210 to position an indicator, 'P,' in association with a parameter portion of block 405 (e.g., a portion of block 405 associated with representing parameters of block 405). Assume that P identifies a structure variable. This may cause client device 210 to group parameters 420 into one or more structure parameters associated with the structure variable. In another example, client device 210 may receive an instruction associated with a bus object, rather than a structure variable, and may group the parameters in association with the bus object.

As further shown in FIG. 4A, and by reference number 430-3 and 430-4, client device 210 may receive, via a user interface, an interaction causing client device 210 to position a first indicator 'A,' of a first structure variable. Similarly, client device 210 may position a second indicator 'B,' of a second structure variable. A and B may be positioned at output portions of block 405. This may cause client device 210 to group output signals 415 into respective structure signals for the first structure variable and the second structure variable. Client device 210 may group the respective structure signals based on the program code representation of block 405. In another example, client device 210 may receive an instruction associated with a bus object, rather than a set of structure variables, and may group output signals 415 in association with the bus object.

In another example, when client device 210 determines that block 405 includes more internal outputs than are associated with signals, extraneous output signals may be terminated. Additionally, or alternatively, when client device 210 determines that block 405 includes fewer internal outputs than are associated with signals 460, client device 210 may cause extra signals to be grounded signal elements.

As shown in FIG. 4B, based on receiving the interactions to configure the interface adapter, client device 210 provides a representation of block 405 with the interface adapter configured. For example, client device 210 represents input signals 410 as input signals 450 (e.g., a set of input vectors) associated with a variable 455. Similarly, client device 210 represents output signals 415 as output signals 460 (e.g., a set of structure signals) with structure variables 465 (e.g., 'A' and 'B'). Similarly, client device 210 represents parameters 420 as one or more structure parameters of variable 470 (e.g., a structure variable).

As indicated above, FIGS. 4A and 4B are provided merely as an example. Other examples are possible and may differ from what was described with regard to FIGS. 4A and 4B.

FIGS. 5A and 5B are diagrams of an example implementation 500 of interface adaptation.

With regard to FIG. 5A, client device 210 may configure an interface adapter based on an inheritance from a source, a destination, a parent, or the like. A source may refer to a source of a signal (e.g., a source block). Similarly, a destination may refer to a destination of a signal (e.g., a destination block). A parent may refer to a parent subsystem with which a particular block is associated.

Block 505 is associated with receiving data included in a set of signals 510 and providing a set of signals 515. Block 505 may receive signals 510 from a first source block S1 and a second source block S2. Block 505 may provide data, via signals 515, to a first destination block D1 and a second destination block D2. Block 505 may include a set of parameters (e.g., "$P_1, P_2, \ldots, P_L$"). Block 505 may include a textual element associated with representing program code 525.

Client device 210 may analyze program code 525, and may determine that S1 is associated with an output of a vector [4] (e.g., a vector associated with 4 values corresponding to 4 signals of signals 510) and that S2 is associated with an output of a vector [2]. Client device 210 may configure an interface adapter to cause the 6 total input elements of S1 and S2 to be partitioned into two input ports of block 505. Similarly, client device 210 may analyze program code 525, and may determine that D1 is associated with receiving a structure signal with a set of field names (e.g., "$y_1, y_2, y_3$") and that D2 is associated with receiving a structure signal with a set of field names (e.g., "$y_5, \ldots, y_J$"). Client device 210 may configure the interface adapter to package output elements of block 505 (e.g., signals 515) into 2 structure signals for transmission to D1 and D2. Similarly, client device 210 may analyze program code 525, and may determine that the set of parameters is associated with a structure parameter. Client device 210 may configure the interface adapter to group parameters $P_1, P_2, \ldots, P_L$ into a structure parameter $P_S$.

With regard to FIG. 5B, client device 210 may provide a presentation of block 505 and the interface adapter based on configuring the interface adapter. As shown by reference number 550, blocks S1 and S2 may provide input to block 505 that is partitioned into two signals for receipt as vector 555 (e.g., "[V]") via input ports of block 505. As shown by reference number 560, blocks D1 and D2 may receive output from block 505 that is packaged into two structure signals including two structure variables 565 (e.g., respectively, a first structure variable "[A]" and a second structure variable "[B]"). As shown by reference number 570, block 505 may be presented as including a single structure parameter $P_s$ representing the group of parameters 520.

As indicated above, FIGS. 5A and 5B are provided merely as an example. Other examples are possible and may differ from what was described with regard to FIGS. 5A and 5B.

Figure 6A:
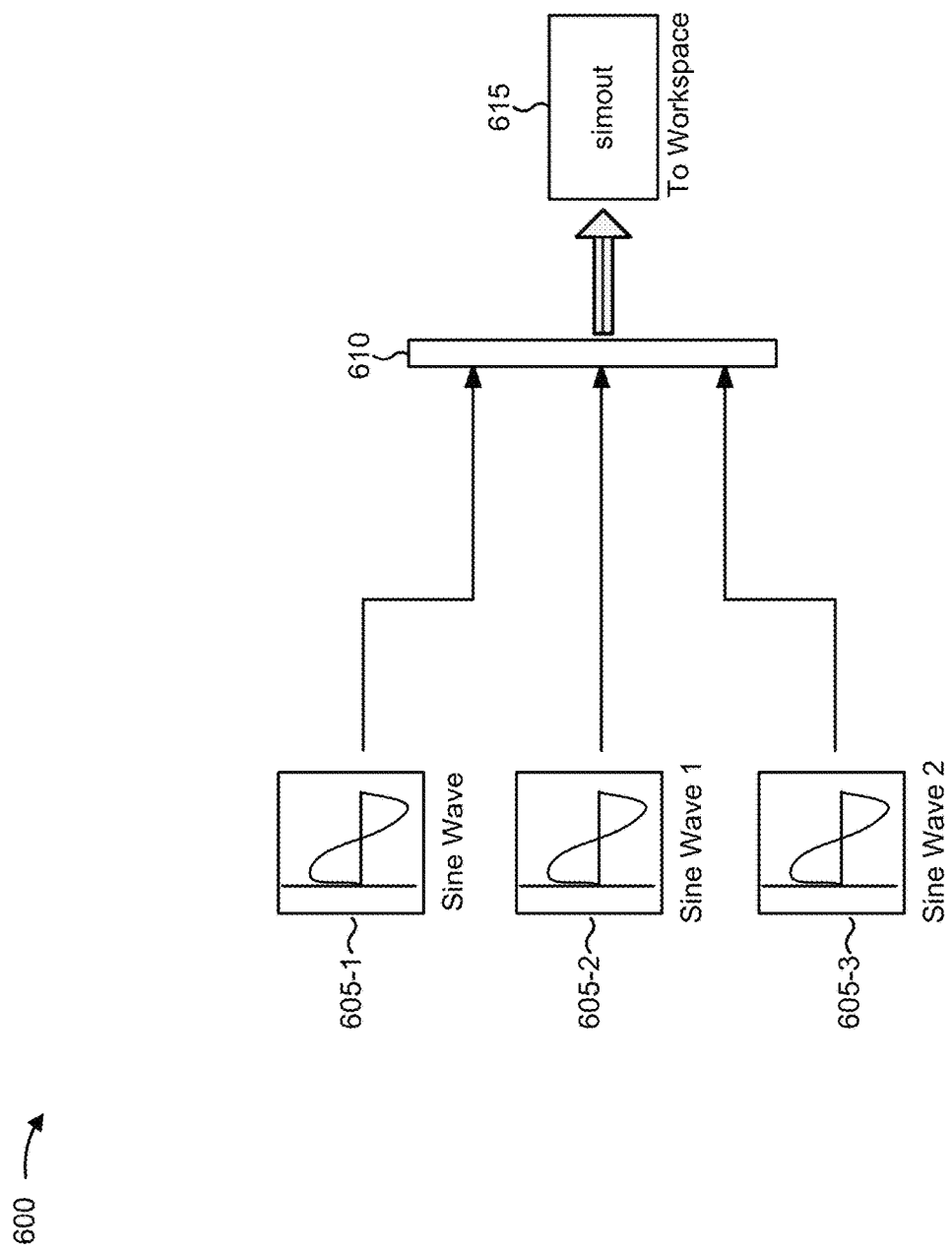
FIGS. 6A and 6B are diagrams of another example implementation of interface adaptation.
Figure 6B:
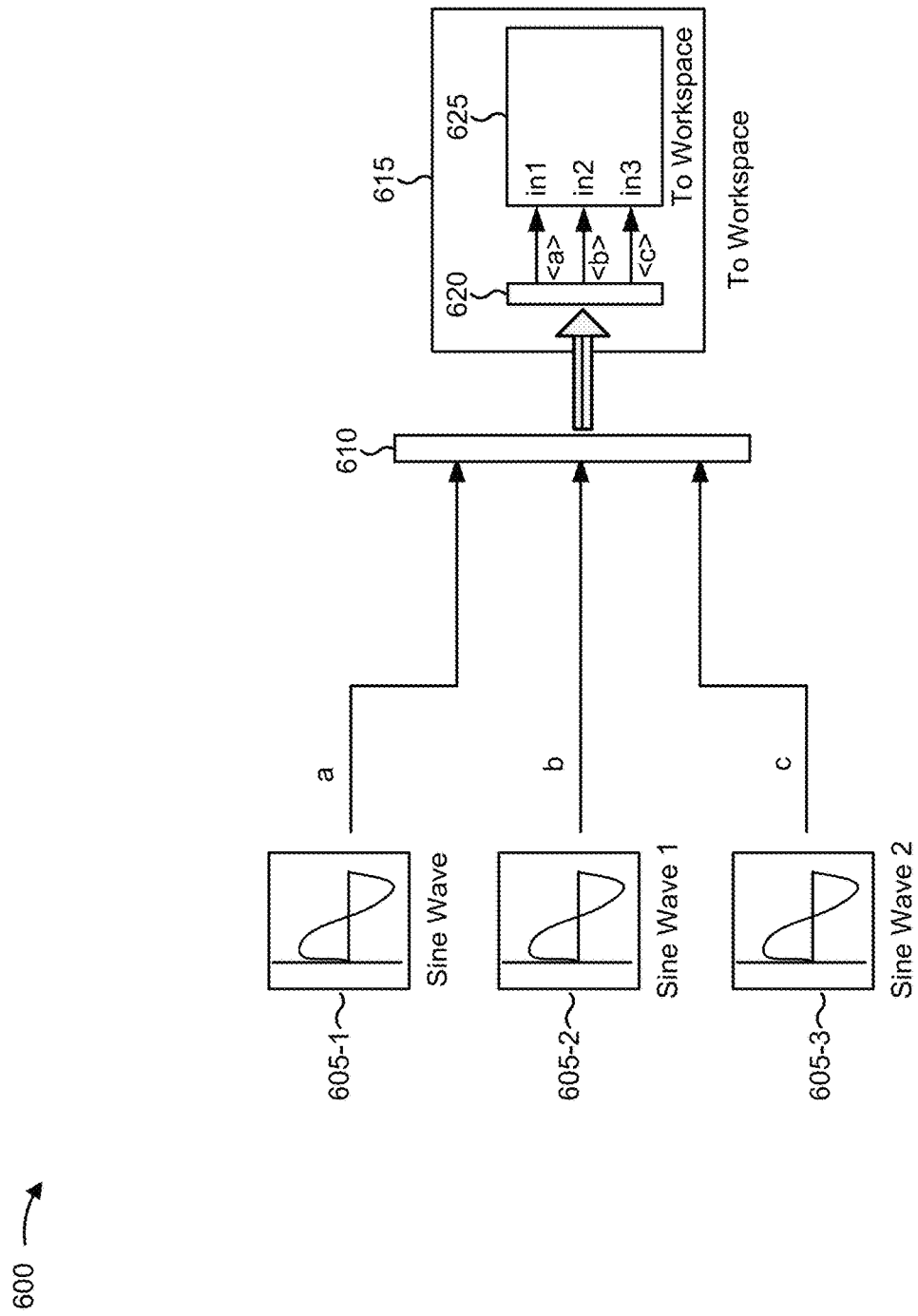

FIGS. 6A and 6B are diagrams of an example implementation 600 of interface adaptation.

FIG. 6A illustrates an external representation of a model. The external representation may abstract one or more functionalities being performed by an interface adapter (e.g., an expansion layer). The model may represent a bus signal (e.g., a composite signal) being logged to a "To Workspace"

block. As shown by reference numbers 605-1, 605-2, and 605-3, the model may include a set of signal elements of the bus signal (e.g., "Sine Wave," "Sine Wave 1," and "Sine Wave 2"). The set of signal elements may be combined at model element 610 and provided to block 615 (e.g., the "To Workspace" block). Each signal element of the bus signal may be associated with one or more signal attributes (e.g., a dimension, a data type, a sample rate, or the like). Signal elements of the bus signal may be associated with different signal attributes. Block 615 may include a single graphical port to which the bus signal is directed. Assume that the single graphical port is not configured to receive the single bus signal.

FIG. 6B illustrates an internal representation of the model. The internal representation provides a granular view of the functionalities being performed by the interface adapter. With regard to FIG. 6B, client device 210 may configure the interface adapter to generate a port expansion layer to cause block 625 to be configured to receive the bus signal via the single graphical port. As shown by reference numbers 620 and 625, client device 210 may perform a subsystem generation procedure. For example, client device 210 may automatically generate a subsystem including an inport block (e.g., an input to block 615), a bus selector (e.g., to process data in the bus signal and output the data as separate signal elements), and a multi-port "To Workspace" block (e.g., which includes inports "in1," "in2," and "in3") to process the bus signal. Client device 210 maps the graphical port to the set of internal ports using a set of connector lines (e.g., via model element 610 and bus selector 620).

In another example, client device 210 may utilize an expansion layer for other blocks, such as s-functions, MATLAB systems, MATLAB functions, Stateflow diagrams, model reference blocks, or the like. In this manner, client device 210 generates a port expansion layer that permits block 615 to perform functionalities, such as processing a bus signal or the like.

In this manner, client device 210 improves graphical modeling by obviating the need for a user to design a subsystem to expand a bus and provide the bus to a block. Moreover, client device 210 reduces bookkeeping associated with managing interface expansion for interfaces with large (e.g., greater than a threshold) quantities of ports. Furthermore, client device 210 reduces a quantity of errors associated with adapting a block to receive a bus signal relative to a manual adaptation.

As indicated above, FIGS. 6A and 6B are provided merely as an example. Other examples are possible and may differ from what was described with regard to FIGS. 6A and 6B.

Figure 7A:
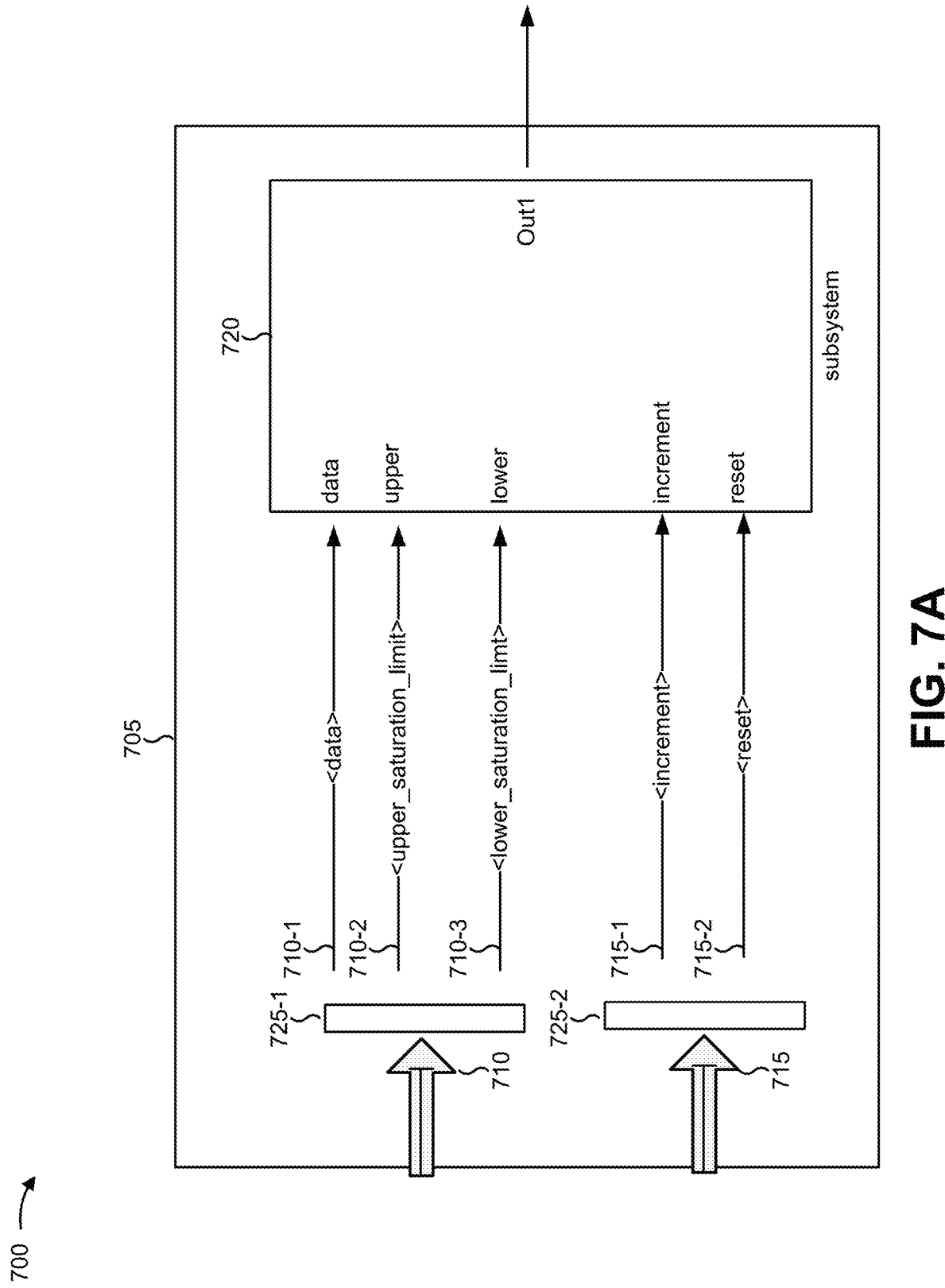
FIGS. 7A-7C are diagrams of another example implementation of interface adaptation.
Figure 7B:
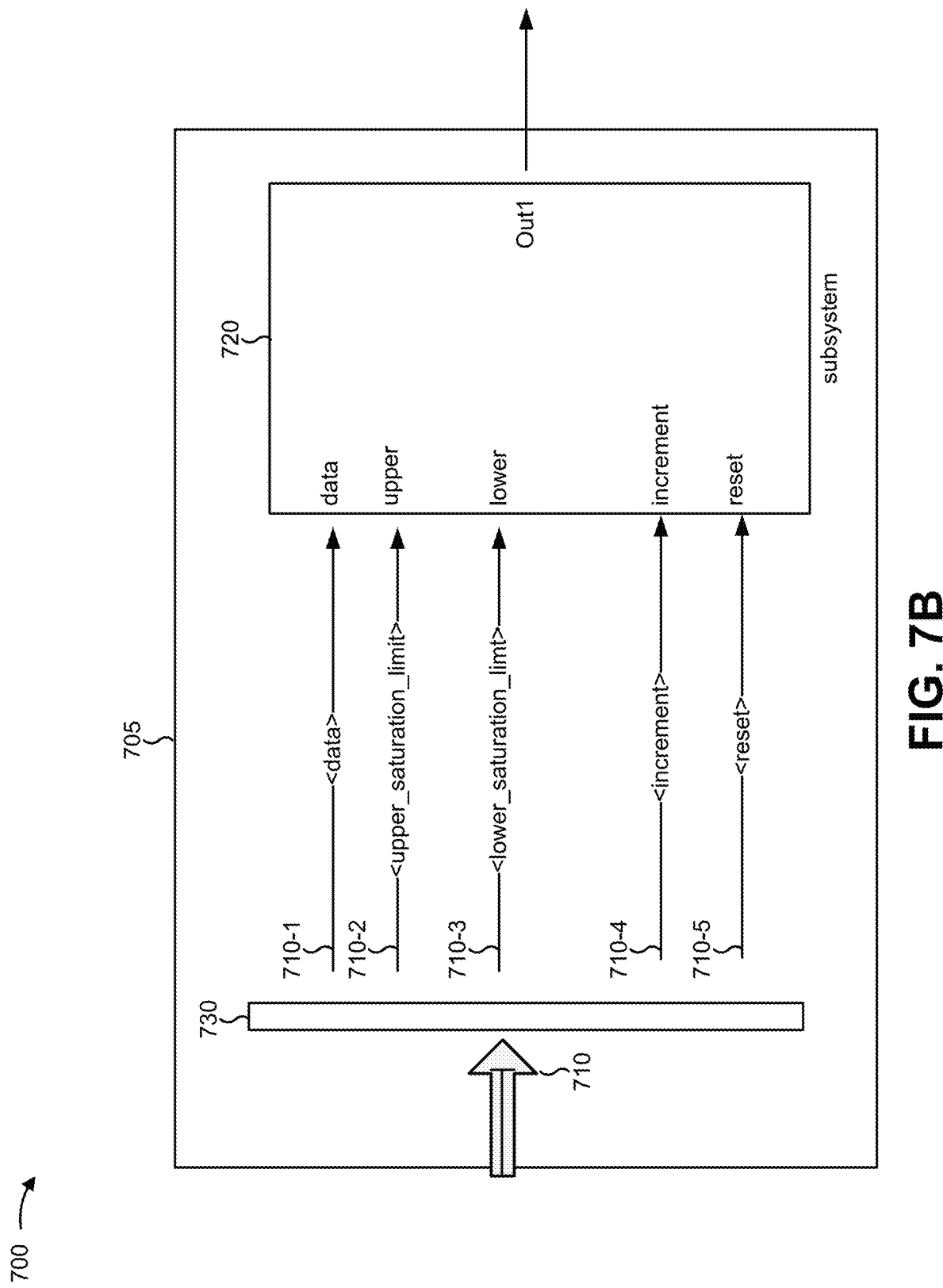
Figure 7C:
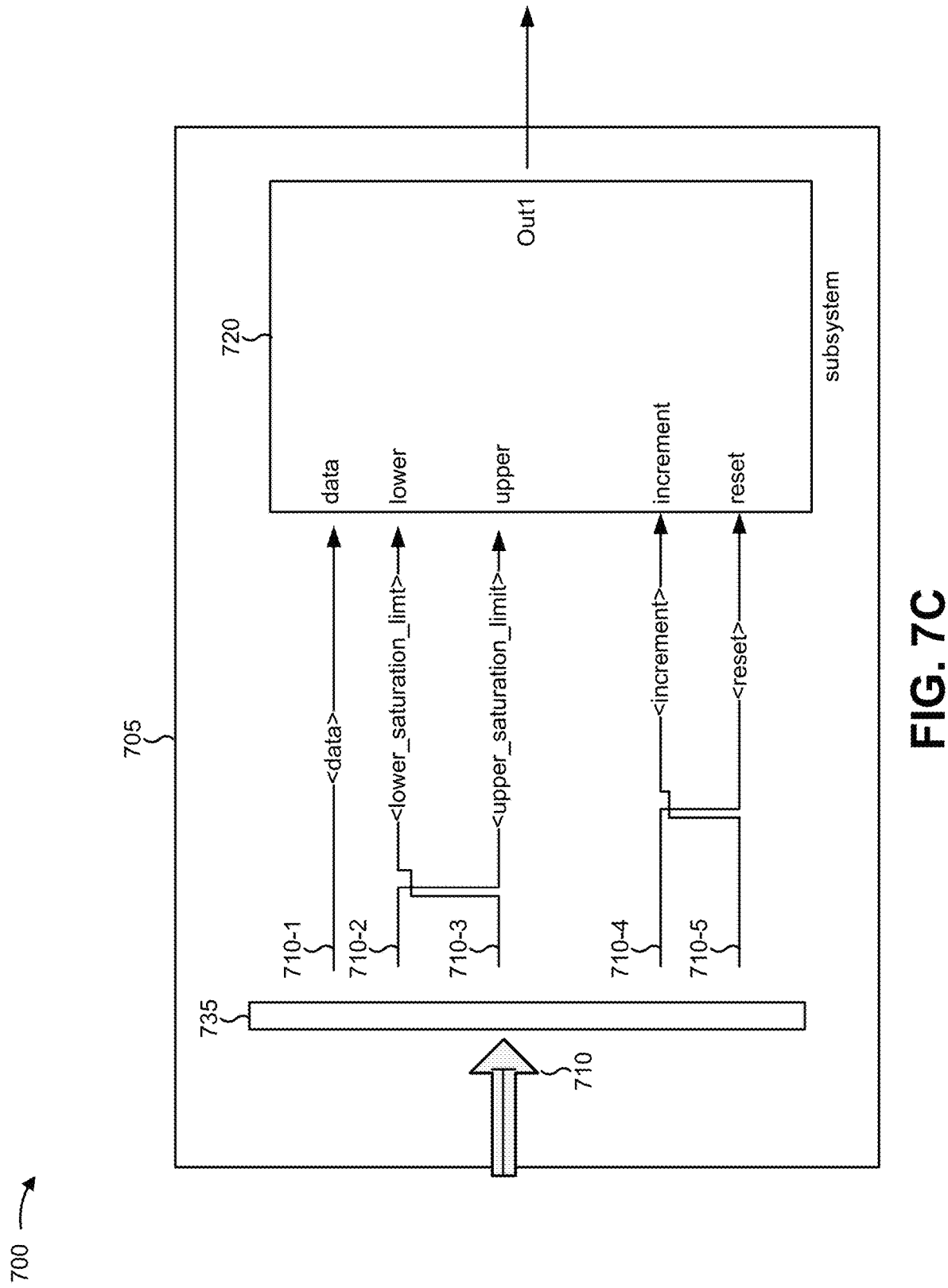

FIGS. 7A-7C are diagrams of an example implementation 700 of interface adaptation.

With regard to FIG. 7A, client device 210 may utilize an interface adapter to automatically adapt a block 705 to receive information. Assume that block 705 includes two graphical input ports for receiving signals conveying the information. The information may be received as a first bus signal 710 and a second bus signal 715. First bus signal 710 includes three signal elements 710-1, 710-2, and 710-3, respectively. Second bus signal 715 may include two signal elements 715-1 and 715-2. A signal element may refer to a portion of a signal, such as a particular signal included in a bus signal, a bus signal included within another bus signal, or the like. Client device 210 may cause a first bus selector 725-1 and a second bus selector 725-2 to be generated to receive bus signal 710 and bus signal 715, respectively. The interface adapter may cause bus selector 725-1 and 725-2 to map signal elements 710-1, 710-2, 710-3, 715-1, and 715-2 to 5 internal input ports of subsystem 720 (generated by client device 210). In this manner, client device 210 permits block 705 to receive and process the information included in bus signals 710 and 715.

As shown in FIG. 7B, client device 210 may utilize an interface adapter to automatically adapt a similar block 705 to receive information. Block 705 may include a single graphical input port that receives a single bus signal 710, which includes five signal elements (e.g., 710-1, 710-2, 710-3, 710-4, and 710-5). Client device 210 may generate a bus selector 730 for the single graphical input port that causes the five signal elements to map to the 5 internal input ports of subsystem 720, thereby permitting block 705 to receive and process the information included in bus signal 710.

As shown in FIG. 7C, client device 210 may utilize an interface adapter to automatically adapt another similar block 705 to receive information. Block 705 may include a single graphical input port for receiving a single bus signal 710, which includes five signal elements (e.g., 710-1, 710-2, 710-3, 710-4, and 710-5). The five signal elements may be included in the bus signal in a different order than an order with which block 705 is configured to receive the signal elements. Client device 210 may parse signal element names (e.g., "<data>," "<upper_saturation_limit>," "<lower_saturation_limit>," "<reset>," and "<increment>") and may generate a bus selector 735 and a set of connector lines to map the signal elements to corresponding internal ports of subsystem 720 (e.g., with names "data," "upper," "lower," "increment," and "reset"). In this way, client device 210 facilitates a rearrangement of signals to automatically map signals to corresponding inputs. In another example, client device 210 may utilize different information to permit a mapping, such as based on matching a set of identifiers, matching an attribute of an output block (e.g., block 735) to an attribute of an input block (e.g., block 720), a characteristic of a signal, or the like.

As indicated above, FIGS. 7A-7C are provided merely as an example. Other examples are possible and may differ from what was described with regard to FIGS. 7A-7C.

FIGS. 8A-8D are diagrams of an example implementation 800 of interface adaptation.

Figure 8A:
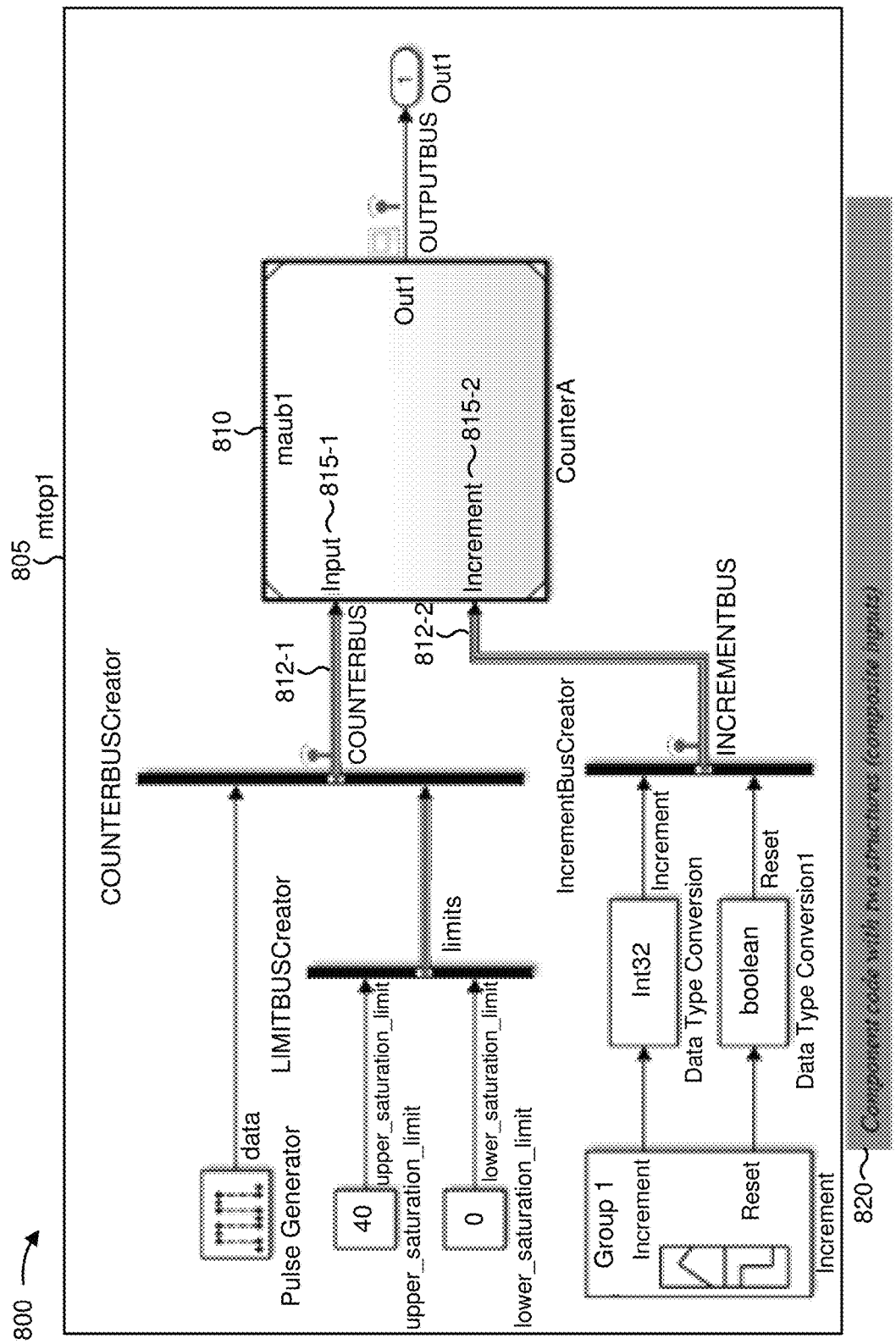
FIGS. 8A-8D are diagrams of another example implementation of interface adaptation.

FIG. 8A may illustrate a view of a model 805 (e.g., "mtop1"), which includes a model block 810 (e.g., "CounterA"). Model block 810 may include an internal model (e.g., "msub1") that is associated with performing one or more functionalities of model block 810. Model block 810 may be associated with receiving bus signals 812-1 and 812-2 (e.g., respectively, "COUNTERBUS" and "INCREMENTBUS"). Model block 810 may include composite ports (i.e., graphical inputs) 815-1 and 815-2 (e.g., respectively, "Input" and "Increment"). Composite ports 815-1 and 815-2 may receive bus signals 812-1 and 812-2, respectively. As shown by reference number 820, client device 210 may generate program code for the composite ports. In this case, the program code may reference the set of bus signals, thereby providing program code that is easily understandable to a user viewing the view of model 805 provided in FIG. 8A.

In some implementations, the program code may be editable program code, and an edit to the program code may be integrated into a presentation of the composite ports. For example, client device 210 may receive an edit to the program code, such as a rearrangement of arguments relating to the composite ports, and client device 210 may rearrange a presentation of the composite ports in model 805 based on the rearrangement of the arguments relating to the composite ports. In this way, client device 210 ensures that the model and program code correspond in an easily understandable manner.

Figure 8B:
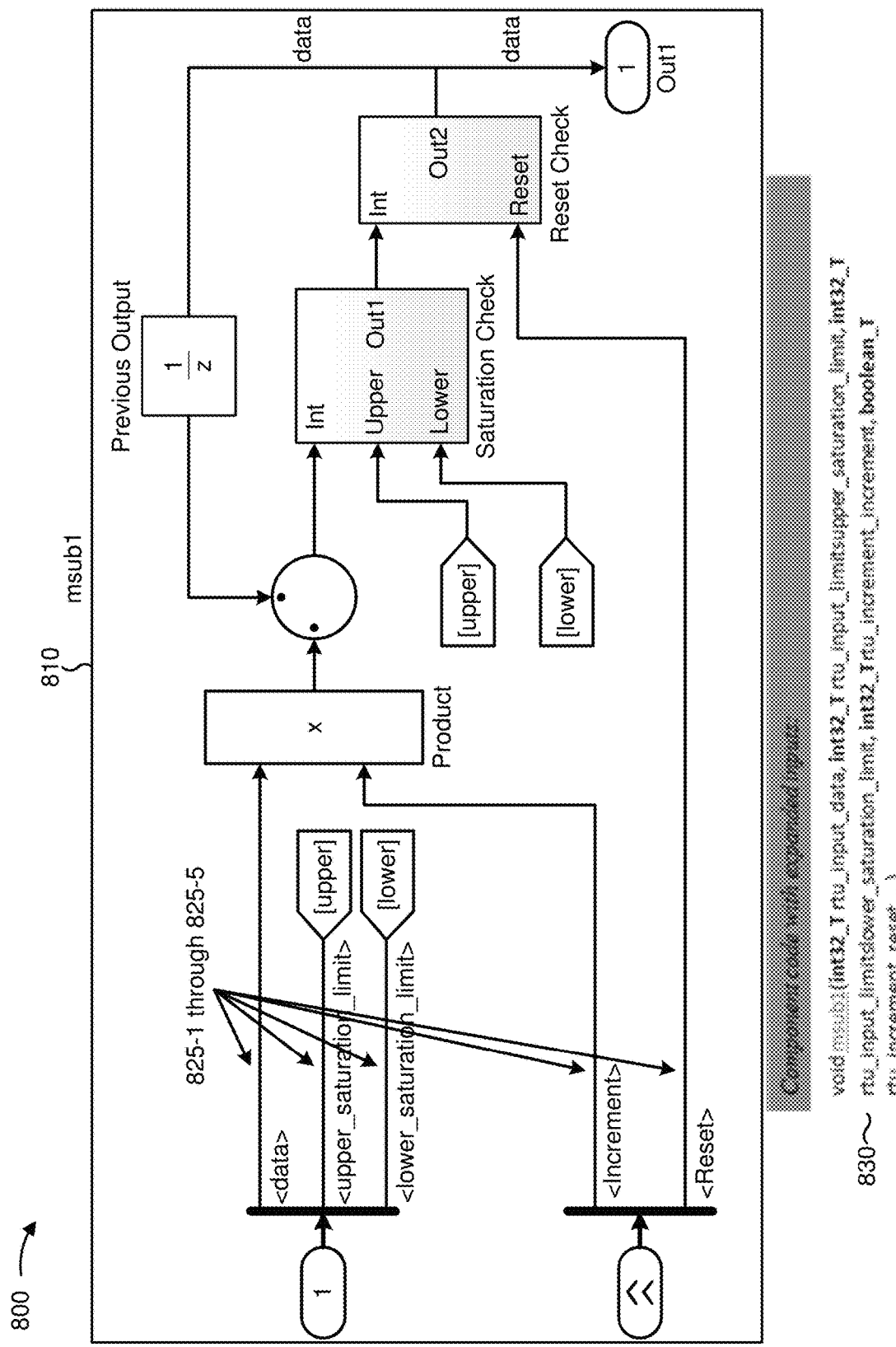

FIG. 8B may illustrate a view of an internal model referenced by model 805 via model block 810. As shown in FIG. 8B, model block 810 may include an expanded set of input ports (e.g., internal inputs) 825-1 through 825-5 to receive bus signals 812-1 and 812-2. The set of input ports 825-1 through 825-5 may include, respectively, "<data>," "<upper_saturation_limit>," "<lower_saturation_limit>," "<increment>," and "<reset>"). As shown by reference number 830, client device 210 may generate program code for the expanded set of input ports that references the signal elements of the set of bus signals, thereby providing program code that is easily understandable to a user viewing the view of model block 810 shown in FIG. 8B. In this way, client device 210 can generate program code that includes a code interface that corresponds to an interface of a graphical model. For example, client device 210 may generate a first version of program code with a first code interface that corresponds to an interface of a particular component and a second version of program code with a second code interface that corresponds to an interface of a port expansion layer, a hierarchical expansion layer, or the like.

In this manner, client device 210 may provide a user with program code that corresponds to the graphical inputs or the internal inputs, thereby improving code readability. For example, a user assigned to debug problems with model 805 may prefer code simplifying model block 810 to the graphical input representation. In contrast, a user assigned to debug problems with model block 810 may prefer code representing the internal inputs of model block 810.

Figure 8C:
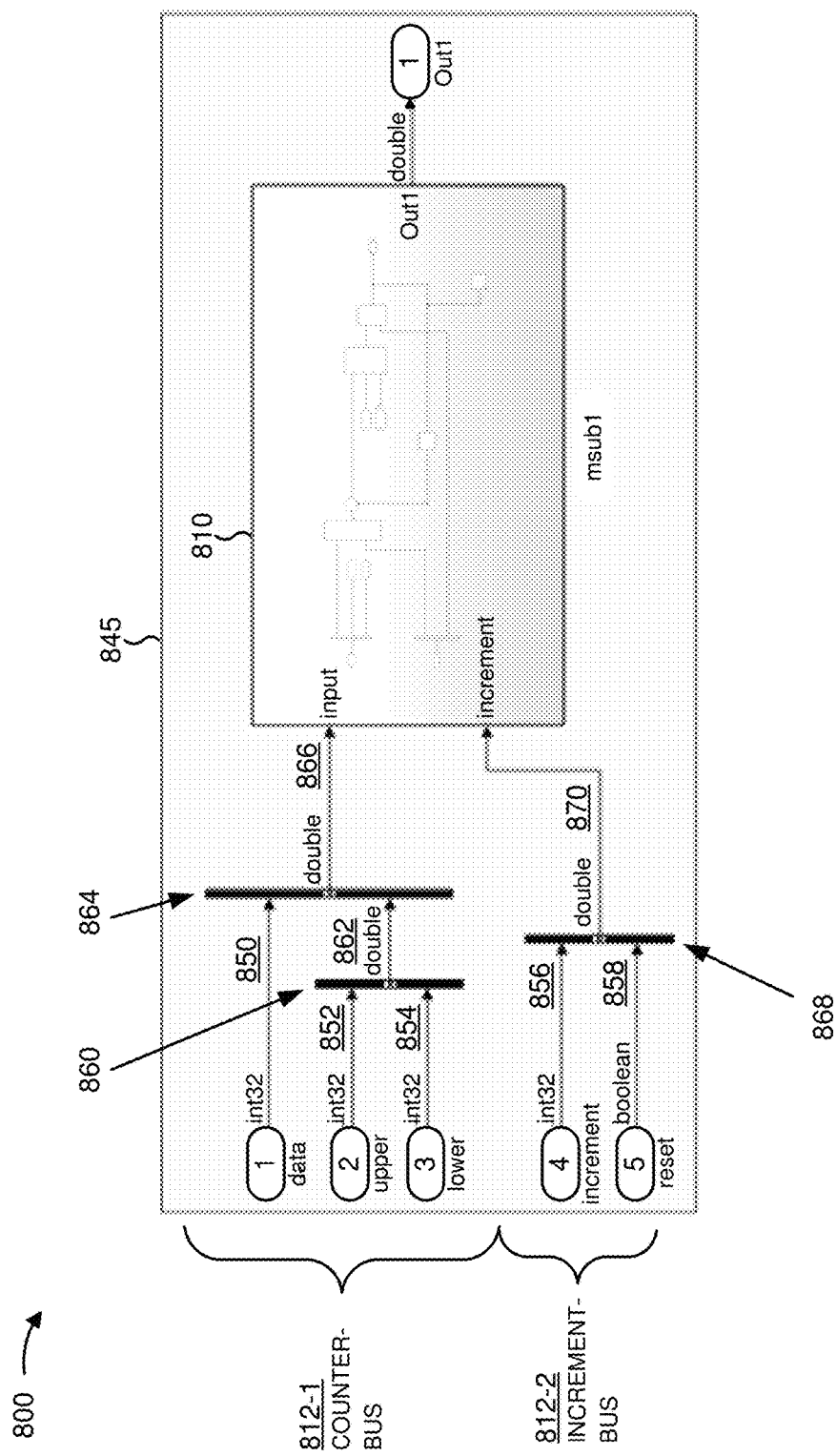

FIG. 8C may illustrate an interface adapter (e.g., a port expansion layer 845) for model block 810. The first bus signal 812-1 of model 805 may include a first signal element 850 (e.g., a 32-bit integer (int32), "data"), a second signal element 852 (e.g., an int32, "upper"), and a third signal element 854 (e.g., an int32, "lower"). The second bus signal of model 805 may include a first signal element 856 (e.g., an int32, "increment") and a second signal element 858 (e.g., a Boolean, reset).

As further shown with regard to FIG. 8C, client device 210 may generate bus creator 860, which receives signal elements 852 and 854, and which provides signal 862 (e.g., a double). Client device 210 may generate bus creator 864, which receives signal element 850 and signal 862, and which provides signal 866 (e.g., a double) to a first input of model block 810. In this way, three signal elements of first bus signal 812-1 are provided to a single input port of model block 810 via port expansion layer 845.

As further shown with regard to FIG. 8C, client device 210 may generate bus creator 868, which receives signal elements 856 and 858, and which provides signal 870 (e.g., a double) to a second input of model block 810. In this way, two signal elements of second bus signal 812-2 are provided to a single input port of model block 810 via port expansion layer 845.

In some implementations, client device 210 may generate program code representing bus creator 868 and/or one or more other components of an interface adapter. For example, client device 210 may generate program code to permit simulation. In this case, when client device 210 determines to generate program code for model 805, client device 210 may generate program code representing model 805 including the interface adapter, rather than generating program code representing an underlying model of model 805 (i.e., model 805 not including the interface adapter). In another example, based, for example, on a user selection, client device 210 may generate the program code based on model 805 not including the interface adapter. In some implementations, client device 210 may insert generated code at a particular location. For example, when an interface adapter is generated at the callee side of model 805, as in FIG. 8B, client device 210 may generate program code representing the interface adapter at a portion of program code associated with the callee side of model 805. In contrast, when an interface adapter is generated at the caller side of model 805, as in FIG. 8C, client device 210 may generate program code representing the interface adapter at a portion of program code associated with the caller side of the model.

In this way, client device 210 provides a layered view of the interface adapter of model 805 in relation to the internal model of model block 810.

Figure 8D:
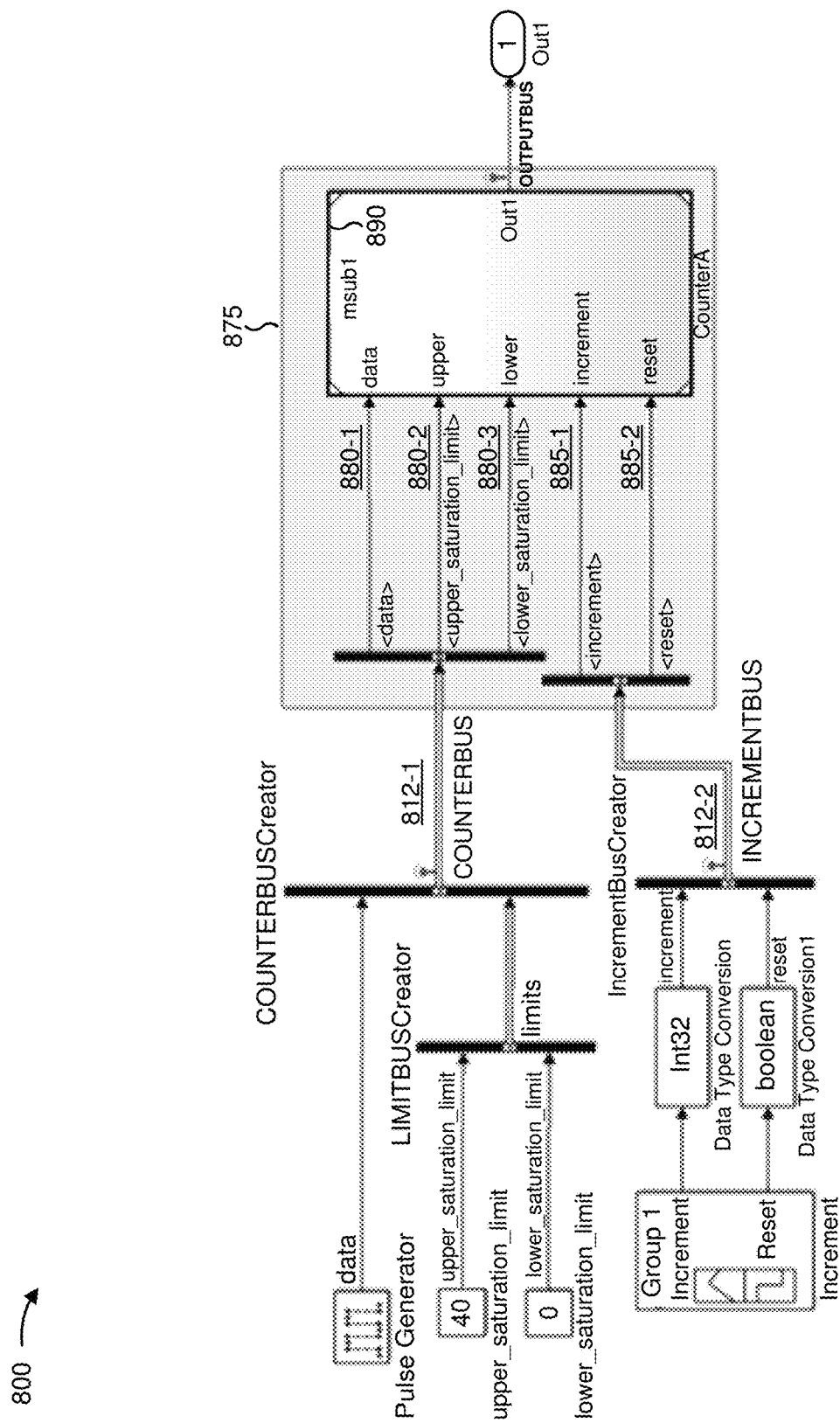

FIG. 8D may illustrate a view of the interface adapter (e.g., another port expansion layer 875) for the internal model of block 810. The interface adapter may correspond to the interface adapter shown in FIG. 7A. In this way, client device 210 provides another layered view of the interface adapter of model 805 in relation to model 805.

As indicated above, FIGS. 8A-8D are provided merely as an example. Other examples are possible and may differ from what was described with regard to FIGS. 8A-8D.

Figure 9:
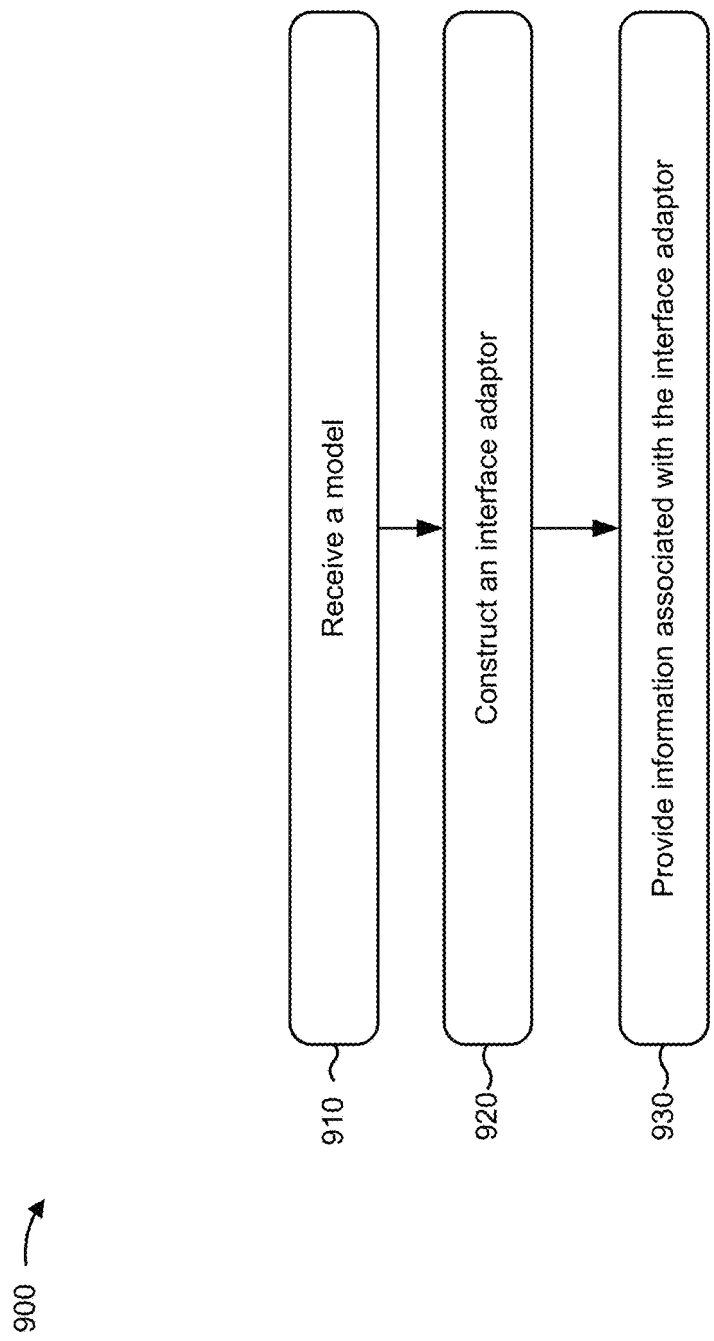
FIG. 9 is a flow chart of an example process for interface adaptation.

FIG. 9 is a flow chart of an example process 900 for port management for a graphical model. In some implementations, one or more process blocks of FIG. 9 may be performed by client device 210. In some implementations, one or more process blocks of FIG. 9 may be performed by another device or a group of devices separate from or including client device 210, such as server device 230.

As shown in FIG. 9, process 900 may include receiving a model (block 910). For example, client device 210 (e.g., TCE 220) may receive a model (e.g., a graphical model). In some implementations, client device 210 (e.g., TCE 220) may receive the model based on a user creating the model. For example, a user may cause client device 210 to create or open a user interface. The user may then cause client device 210 to add one or more model blocks and/or model elements to the user interface to create the model. In some implementations, client device 210 may receive a command, from the user, that indicates that a model block and/or a model element is to be added to the user interface. Client device 210 may receive the command based, for example, on detecting a selection of a particular menu item, entry of a particular textual or audible input from the user, and/or entry of some other predetermined input that indicates a desire to add a model block and/or a model element to the user interface. As another example, client device 210 may receive input (e.g., a drag and drop) that indicates that a model block and/or a model element, included in a block library and/or a model element library associated with TCE 220, is to be added to the user interface. Based on the command, client device 210 may add the model block and/or the model element to the user interface.

In some implementations, client device 210 may receive information identifying the model, such as a name of the model, and information identifying a memory location at which the model is stored. The memory location may be located within client device 210 or external to, and possibly remote from, client device 210. Client device 210 may, based on receiving the request, retrieve the model from the memory location. In some implementations, client device 210 may determine information about a portion of a model based on information associated with the model. For example, client device 210 may obtain an XML file associated with a model, and may parse the XML file to determine information regarding a model block of the model, a port of the model, or the like. In this case, client device 210 may utilize a natural language processing technique, an XML parsing technique, a matching technique (e.g., to compare the XML file to another XML file stored via a repository of XML files), or the like to determine the information.

As further shown in FIG. 9, process 900 may include constructing an interface adapter (block 920). For example, client device 210 may construct the interface adapter (e.g., one or more expansion layers). In some implementations, client device 210 may construct an interface adapter to cause a component associated with an interoperability issue (e.g., a component that is incompatible with a portion of a model) to be compatible with the portion of the model (e.g., to provide compatibility for two or more components. For example, client device 210 may utilize an interface adapter to perform an adaptation service for (e.g., facilitate an exchange of information between, based on generating an expansion layer to permit compatibility for) a source block and a destination block (e.g., that are graphically connected), a parent system and a child subsystem (e.g., that are associated by a hierarchical relationship), a graphical block to a non-graphical block (e.g., from a first block for which a functionality is represented graphically, such as via iconography, layout, shape, shading, size, etc. to a second block for which the functionality is represented textually or as a binary representation, such as a dynamic-link library (DLL), an executable (EXE), an extensible markup language (XML) interface, MATLAB code, a textual block, etc.), a differential algebraic equation, or the like.

In some implementations, client device 210 may construct a graphical expansion layer as the interface adapter. For example, client device 210 may construct a set of graphical model elements to facilitate interoperability for a set of graphical components. In this way, client device 210 permits interoperability for graphical portions of a model. Additionally, or alternatively, client device 210 may construct a textual expansion, such as for a graphical component and a textual component (e.g., a textual block), a set of textual components, or the like. In this way, client device 210 permits interoperability for textual portions of a model.

In some implementations, client device 210 may construct the interface adapter based on receiving a trigger. For example, client device 210 may detect a user interaction with a particular component provided via a user interface, and may determine that the user interaction is associated with causing the interface adapter to be generated (e.g., for the particular component, for another component, etc.). Additionally, or alternatively, client device 210 may be automatically triggered to construct the interface adapter based on an event. For example, client device 210 may receive an instruction to perform a simulation of a model, to generate program code for a model, or the like, and may construct the interface adapter for one or more portions of the model based on receiving the instruction.

In some implementations, client device 210 may provide one or more user interface elements associated with configuring the interface adapter. For example, client device 210 may provide an option to enable/disable construction of the interface adapter. Additionally, or alternatively, client device 210 may provide an option to switch views of a model and/or an interface adapter associated therewith after the interface adapter is constructed. For example, client device 210 may receive a selection to provide a first view presenting an input/output signal structural view. Additionally, or alternatively, client device 210 may receive a selection to provide a flat view (e.g., that simplifies the model). Additionally, or alternatively, client device 210 may receive a selection to provide a hybrid view (e.g., that simplifies a first portion of the model and provides an input/output signal structural view of a second portion of the model). In some implementations, client device 210 may automatically select a presentation based on an environment, such as a simulation environment, a debugging environment, a code generation environment, or the like.

In some implementations, client device 210 may identify one or more components for which to construct the interface adapter. For example, client device 210 may determine, for an output interface of a first block and an input interface of a second block, that the input interface and the output interface are associated with different communications requirements. In some implementations, the different communications requirements may include a temporal difference (e.g., a sample time difference), a spatial difference (e.g., a fixed point and floating point representation difference), a structural difference (e.g., an aggregation of elements difference), a complexity difference (e.g., a real part and imaginary part difference), a domain difference (e.g., whether a port represents a causal relation, a non-causal relation, or the like), a connection difference (e.g., a difference relating to equality, assignment, production or consumption, etc.), an execution difference (e.g., a difference relating to a discrete time execution, a discrete event execution, a continuous time execution, a blocking or non-blocking execution, etc.). For example, the first block and the second block may be associated with different signal dimensions, different signal data types, different signal sample rates, or the like. Similarly, a first port may be a causal port and a second port may be a non-causal port, and client device 210 may determine to generate a set of components to create a connection between the first port and the second port. Additionally, or alternatively, client device 210 may determine that a first block and a second block are associated with similar internal implementations (e.g., referenced models), but are associated with different graphical interfaces (e.g., graphical representations of external ports), such as different iconography, port layouts, geometric shapes, sizes, colors, annotations, shading, badges, or the like.

Additionally, or alternatively, client device 210 may determine that parameters (e.g., of a block) mismatch required parameters. For example, client device 210 may determine that parameters of a particular block are grouped into a structure variable in a parent system. In this case, client device 210 may construct an interface adapter to perform the grouping of the parameters, such as based on a model hierarchy, a heterogeneous grouping associated with a characteristic of the parameters being grouped, or the like. In some implementations, the grouping may be selected by a user via client device 210. For example, the user may select a set of parameters that are associated with the same characteristic (e.g., a particular data type), and may cause the parameters to be grouped into the structure variable. Additionally, or alternatively, client device 210 may automatically group the set of parameters based on the set of parameters being associated with the same characteristic, such as based on determining that each parameter of the set of parameters are associated with the particular data type.

In some implementations, client device 210 may identify a particular signal or parameter for which to construct the interface adapter. For example, client device 210 may construct the interface adapter to perform a data conversion associated with a particular signal or parameter, such as for vector-type data, matrix-type data, array-type data, a functional mock-up interface (FMI)-type data (e.g., data relating to a set of models of physical or non-physical systems), a functional mock-up unit (FMU)-type data (e.g., a data file storing data relating to an FMI), a differential algebraic equation (DAE) (e.g., a system of DAEs involving functions of an independent variable and/or derivatives thereof), an algebraic equation, composite data (e.g., data constructed from one or more primitives or other composite types), non-composite data (e.g., a primitive or a reference), a combination of composite data and non-composite data, a bus signal, a structure (e.g., a non-virtual bus), an array of bus signals, an array of structure signals, a scalar, a virtual bus (e.g., a tie-wrap), or the like. In this case, as an example, client device 210 may identify a port (e.g., a connection port, a function-call port, an input port, an output port, or the like) or data structure associated with the particular signal or parameter. For example, client device 210 may determine that an input interface is associated with receiving a signal including multiple vectors and that the signal is a matrix. In this case, client device 210 may construct an interface adapter associated with causing the matrix to be received at the interface as the multiple vectors.

In some implementations, client device 210 may utilize a particular application programming interface (API) to obtain, alter, and/or provide information relating to one or more components associated with an interface adapter. For example, client device 210 may utilize an API associated with FMI-type data or FMU-type data such as export commands, import commands, simulation commands, data type alteration commands, output calls, update calls, zero crossing calls, or the like, which may be incorporated into an interface adapter to provide data, receive data, alter data, or the like.

In some implementations, client device 210 may receive information associated with identifying the one or more components for which to construct the interface adapter. For example, client device 210 may provide a drag-and-drop functionality via the user interface to tag a variable, a block, a port, or the like for the interface adapter. Similarly, client device 210 may provide a selection functionality. For example, a user may utilize a selection tool (e.g., a lasso tool, a marquee tool, or the like) to select a set of signals for grouping into a structure variable. Additionally, or alternatively, client device 210 may identify a component that lacks a port for which to generate an interface adapter. For example, when client device 210 detects an interaction (e.g., via a user interface) that is associated with indicating a connection with a block, client device 210 may select the block for an interface adapter that creates a port for the block.

In some implementations, client device 210 may identify the one or more components for which to construct the interface adapter based on associated information. For example, client device 210 may identify a block for which to construct the interface adapter, and may analyze a model that includes the block to identify another component associated with the block, such as a source component (e.g., a source block), a destination component (e.g., a destination block), a parent system (e.g., when the block is a subsystem), an Automotive Open Systems Architecture (AUTOSAR) component, or the like. In this case, client device 210 may construct the interface adapter for the block and the other component based on determining that the other component is associated with the block. In this manner, client device 210 may permit communication between the block and the other component.

In some implementations, client device 210 may identify the one or more components based on information regarding a model. For example, client device 210 may identify an extensible markup language (XML) file including a set of scalar parameters (e.g., an XML file associated with a functional mock-up interface, a functional mock-up unit, or the like). In this case, client device 210 may automatically adapt the set of scalar parameters into a set of structures to utilize the XML file for a model.

In some implementations, client device 210 may identify a component based on a type of signal being received by a type of connection. For example, client device 210 may determine that a first block is associated with a causal connection and a second block is associated with a non-causal connection, and may identify the first block and the second block for constructing the interface adapter based on the mismatch between the causal connection and the non-causal connection.

In some implementations, client device 210 may generate a component when constructing the interface adapter. For example, when generating an expansion layer for the interface adapter, client device 210 may generate a subsystem representing an operation of a model block. Additionally, or alternatively, when generating an interface adapter for a signal, client device 210 may generate a port, a bus selector, a bus creator, or the like to permit a signal to be transmitted. Additionally, or alternatively, client device 210 may generate a signal, alter a signal, generate a parameter, alter a parameter, or the like. For example, client device 210 may generate a port expansion layer that includes a bus, a set of connector lines (e.g., a PhysMod connector line with semantics based on laws of physics, a function-call line, a message line, a control signal line, etc.). In this case, the set of connector lines may be causal or non-causal, may be part of a system of differential and/or algebraic equations, or the like.

Further to the example, a port may be associated with a first set of attributes (e.g., a set of inherited attributes) and client device 210 may associate the port with a connection that is associated with a second, different set of attributes. In this case, client device 210 may adapt the port (e.g., alter the first set of attributes to cause the port to interoperate with the connection associated with the second set of attributes). Additionally, or alternatively, client device 210 may select a version of a component based on attributes of a connection. For example, when the port is polymorphic (e.g., associated with multiple different versions with corresponding attributes), client device 210 may select a version of the port associated with attributes that match the second set of attributes.

In some implementations, client device 210 may adapt a component based on a validity range. For example, client device 210 may determine that a particular connection is associated with a particular validity range (e.g., an accuracy compatibility), and may select one or more components to adapt the connection based on a validity range of the one or more components matching the particular validity range of the particular connection. In some implementations, client device 210 may adapt a component based on a type of unit. For example, client device 210 may determine that a particular connection is associated with a particular type of unit (e.g., a physical unit), and may select one or more components to adapt the connection based on the one or more components being associated with the same type of unit.

Additionally, or alternatively, client device 210 may generate a component associated with changing a state. For example, when client device 210 identifies a state writer block that writes a state with a different structure from another component to which the state is written (e.g., a block, an XML file, a functional mock-up unit (FMU), or the like), client device 210 may generate one or more components associated with altering the state being written to the different structure, to cause the state to match the structure of the other component. Additionally, or alternatively, client device 210 may utilize other state alteration blocks for an interface adapter, such as a state reader block to read a state. In this case, client device 210 may generate one or more blocks to alter the state after reading the state, and a state writer block to write the state after altering the state. In some implementations, client device 210 may generate a component to permit a state writer block associated with a first structure to write to another component with a second structure. For example, using one or more components (e.g., one or more blocks, a command of an FMI API, etc.), client device 210 may generate an interface adapter to permit the state writer block associated with the first structure to write a state to an FMI associated with the second structure.

In some implementations, client device 210 may generate a connection when constructing the interface adapter. For example, client device 210 may generate a link associated with representing and/or causing information to be transmitted from a first portion of a model to a second portion of the model. In some implementations, client device 210 may map a signal when constructing the interface adapter. For example, client device 210 may map a signal element of a bus signal to a particular internal input port of a port expansion layer. Additionally, or alternatively, client device 210 may map a parameter when constructing the interface adapter. For example, client device 210 may map one or more variables of a child subsystem to a structure variable of a parent system. In some implementations, client device 210 may map the one or more variables to the structure variable based on a name of the one or more variables and the structure variable, an identifier associated with the one or more variables and the structure variable, a user input associated with selecting the mapping, or the like.

In some implementations, client device 210 may map a set of connections based on one or more characteristics of an array associated with a port. For example, an array may be associated with a size, a dimension, or the like, and client device 210 may map a set of connections associated with the port based on the size of the array, the dimension of the array, a set of identifiers included in the array, or the like.

In some implementations, client device 210 may receive information associated with determining a mapping. For example, client device 210 may receive, via the user interface, information associated with identifying a port to which to map a signal, a structure variable to which to map a vector variable, or the like. In some implementations, client device 210 may perform a mapping based on corresponding information of a first part and a second part of the mapping. For example, when the first part of the mapping is an English word (e.g., engine) and the second part of the mapping is a German word (e.g., maschine, which translates to engine), client device 210 may determine that the second part is a German word and may translate the German word to English to determine that the first part corresponds to and is to be mapped to the second part. Similarly, client device 210 may account for a partial match when performing a mapping. For example, client device 210 may map a first part to a second part despite a spelling error, a typo, an inclusion or exclusion of a suffix or a prefix, or the like. In this case, client device 210 may perform the mapping based on the first part and the second part satisfying a threshold matching criterion.

Additionally, or alternatively, client device 210 may analyze a signal or a parameter to determine the mapping. For example, client device 210 may map a set of signals graphically (e.g., in a top-to-bottom manner, in a left-to-right manner, etc.). Additionally, or alternatively, client device 210 may map the set of signals based on another ordering. For example, client device 210 may alphabetically map a set of signals to a set of ports based on name information for the set of signals (e.g., a set of signal names) and the set of ports (e.g., a set of port names).

Additionally, or alternatively, client device 210 may map the set of signals based on matching name information (e.g., client device 210 may map a signal identified as "reset" to a port identified as "reset"). Additionally, or alternatively, client device 210 may map the set of signals to the set of ports based on a bus leaf signal depth order (e.g., when the set of signals are signal elements of a bus signal), a hierarchy associated with the set of signals, or the like. In some implementations, client device 210 may map the set of signals based on a specification (e.g., a document describing a mapping of signals). For example, client device 210 may obtain a port expansion specification (e.g., a design document describing ports and signals of a model) for a referenced model of a component, and may perform a mapping of signals to ports (e.g., for an expansion layer of an interface adapter) based on the port expansion specification. In some implementations, client device 210 may obtain information identifying a storage class requirement. For example, client device 210 may map signals to ports based on storage class requirements (e.g., one or more requirements relating to memory requirements of the signals or ports) associated with the signals and the ports (e.g., corresponding a storage class of a particular signal to a port associated with the same storage class).

As further shown in FIG. 9, process 900 may include providing information associated with the interface adapter (block 930). For example, client device 210 may provide information associated with the interface adapter. In some implementations, client device 210 may alter a presentation of one or more components in a user interface. For example, client device 210 may cause a representation of a block to be altered to provide a representation of one or more components associated with the interface adapter, such as one or more bus selectors, one or more internal input ports, or the like. Additionally, or alternatively, client device 210 may alter a presentation of a portion of a model. For example, client device 210 may alter a presentation of one or more blocks of the model to provide information regarding an interface adapter constructed for the one or more blocks of the model, and may hide information regarding the interface adapter from another portion of the model. In this way, client device 210 may avoid adding unnecessary visual complexity to a model (e.g., based on providing a subset of information associated with the model and hiding another subset of information associated with the model).

In some implementations, client device 210 may associate the interface adapter with a layer, of a set of layers, and may provide information associated with the interface adapter based on providing information associated with the layer. For example, client device 210 may classify a set of layers of a model (e.g., layers associated with differing levels of information granularity regarding the model) and may assign a graphical presentation of the interface adapter to a particular layer of the set of layers. In this case, when a user interacts with a user interface to cause client device 210 to provide the particular layer (e.g., or a more granular layer than the particular layer), client device 210 may be caused to provide a representation of the interface adapter. Additionally, or alternatively, client device 210 may provide the representation of the interface adapter when providing a layer, of the set of layers, more granular than the particular layer. In some implementations, client device 210 may provide a representation of a mask associated with a subsystem as a particular layer of the set of layers. A mask may refer to an interface for an underlying block, and may be associated with a logical workspace local to a hierarchy with which the mask is associated, the subsystem with which the mask is associated, or the particular layer with which the mask is associated. In this case, client device 210 may provide a representation of the mask as a layer of a set of layers provided for a model.

In some implementations, client device 210 may provide a textual representation of the interface adapter. For example, client device 210 may generate a textual description of the interface adapter (e.g., a program code description, an extensible markup language (XML) description, etc.) or the like to represent the interface adapter for a textual model. In this way, client device 210 provides information regarding the interface adapter when the interface adapter is constructed for a textual model.

In some implementations, client device 210 may generate program code associated with the interface adapter, and may provide the program code. For example, client device 210 may generate code associated with executing a functionality of the interface adapter (e.g., program code associated with representing a port, program code associated with representing a data type conversion, etc.). In this manner, client device 210 may provide program code that reflects a model with an interface adapter applied, rather than the model without the interface adapter applied, thereby facilitating debugging of the interface adapter. For example, client device 210 may provide first program code that corresponds to the model without the interface adapter, as shown in FIG. 8A (e.g., showing program code representing two components of the model), and second program code that corresponds to the model with the interface adapter, as shown in FIG. 8B (e.g., showing program code representing expanded inputs of the two components rather than the two components). In some implementations, client device 210 may be caused to generate program code representing the model without including program code representing the interface adapter, thereby facilitating debugging of the model without adding unnecessary complexity from interface adapter program code.

In some implementations, client device 210 may cause the model to be executed. For example, client device 210 may execute the model, and may cause two or more (previously) incompatible components to communicate using the interface adapter. For example, a source block may provide a signal to a component via one or more other components constructed for a port expansion layer, an interface adaptation layer, or the like. Similarly, the component may provide a signal to one or more destination blocks via one or more other components constructed for a port expansion layer or the like. In some implementations, client device 210 may cause information to be transferred from a parent system to a child subsystem, from a child subsystem to a parent system, or the like (e.g., based on mapping parameter, mapping inputs, mapping outputs, or the like), as shown with regard to FIGS. 4A and 4B. In this manner, client device 210 automatically facilitates compatibility for a model based on constructing an interface adapter.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, client device 210 automatically generates components and/or maps variables/parameters/signals to cause different components of a model to interoperate. Moreover, client device 210 reduces visual complexity by selectively providing a presentation of an interface adapter and/or selectively providing program code representing the interface adapter. Furthermore, client device 210 reduces a likelihood of modeling errors associated with manually generating components for interoperability, thereby reducing processing associated with repeated iterations of component generation and testing that a user may be required to perform to ensure that components are generated correctly.

FIGS. 10A-10D are diagrams of an example implementation 1000 of interface adaptation.

Figure 10A:
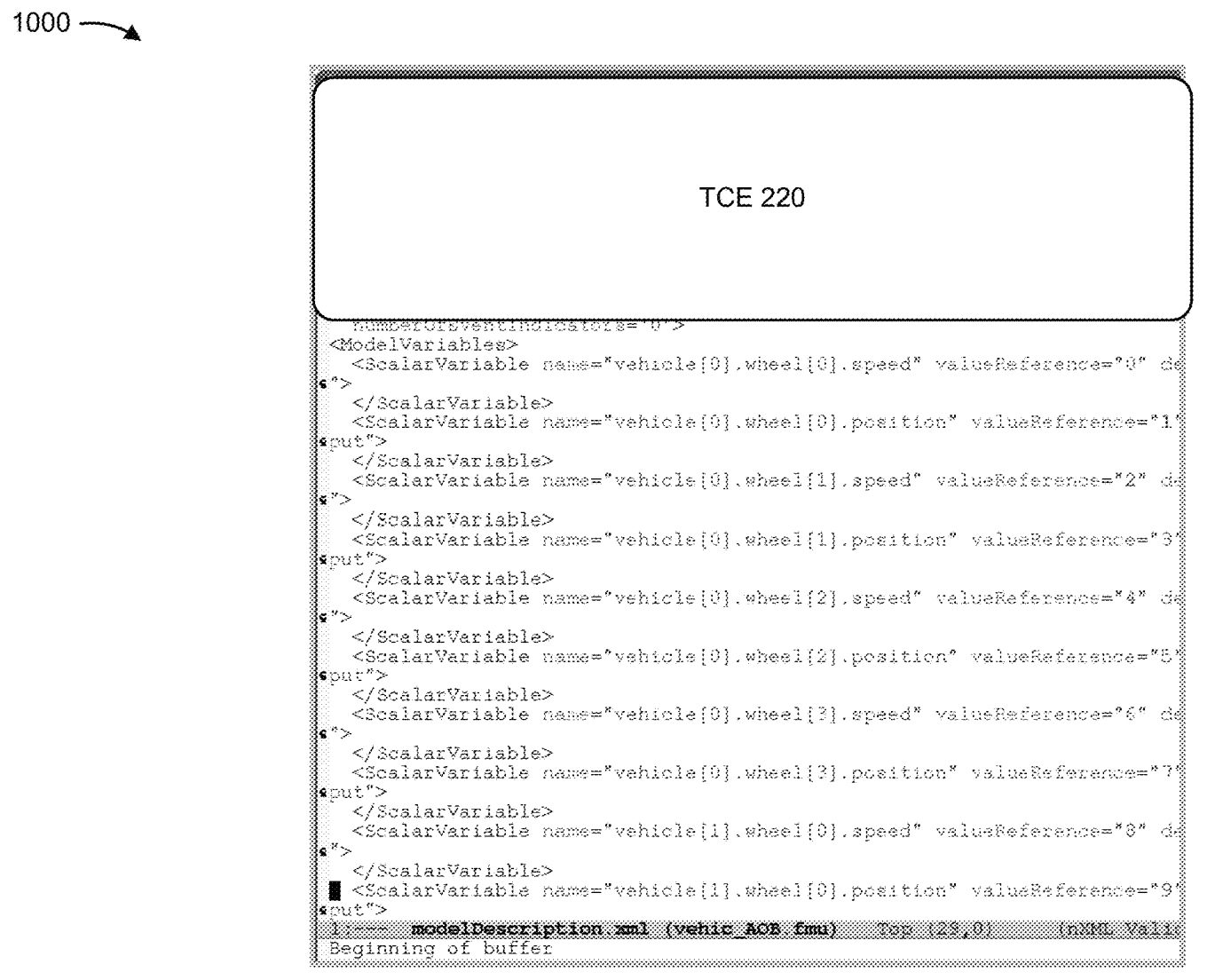
Figure 10B:
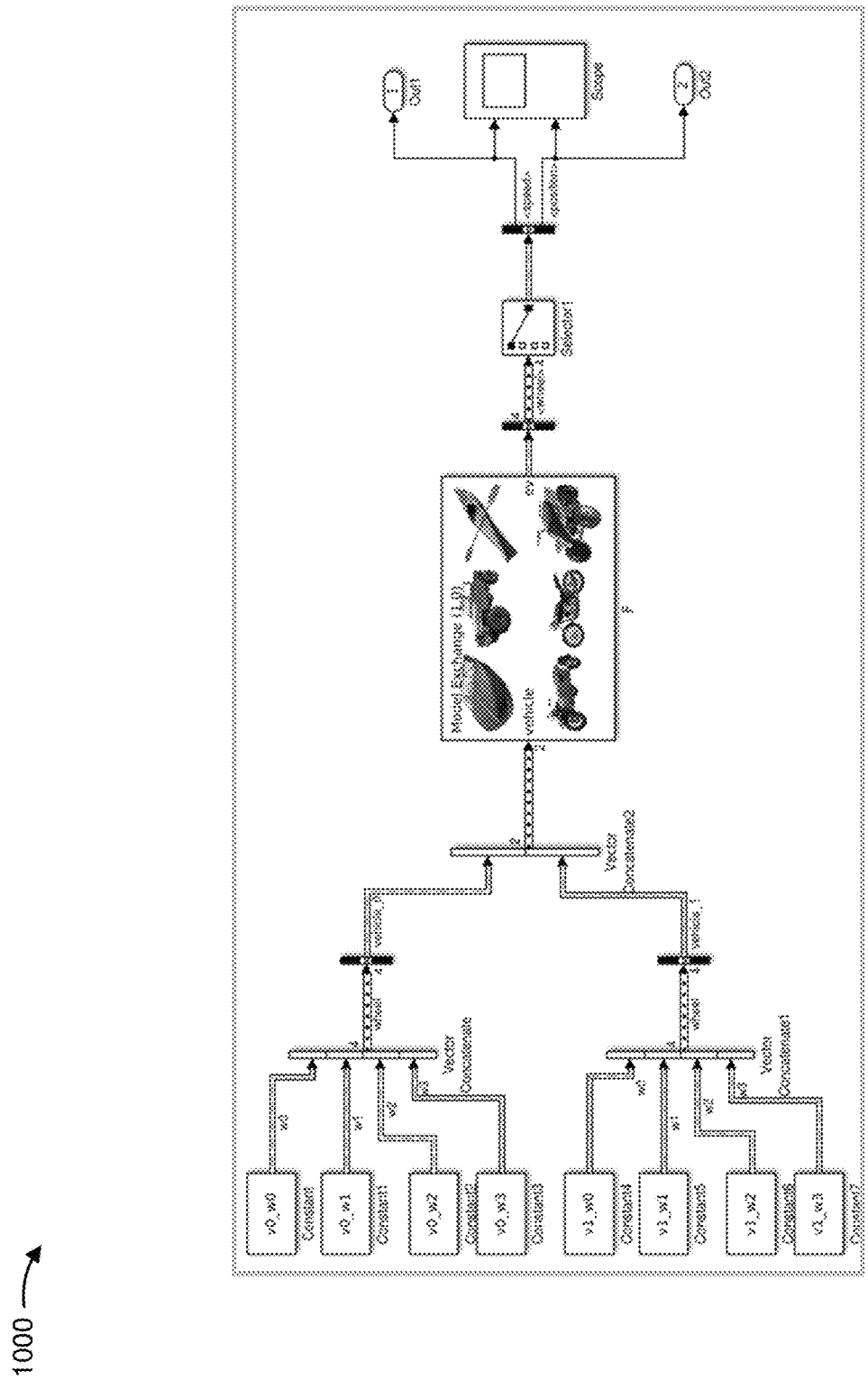
Figures 10C, 10D:
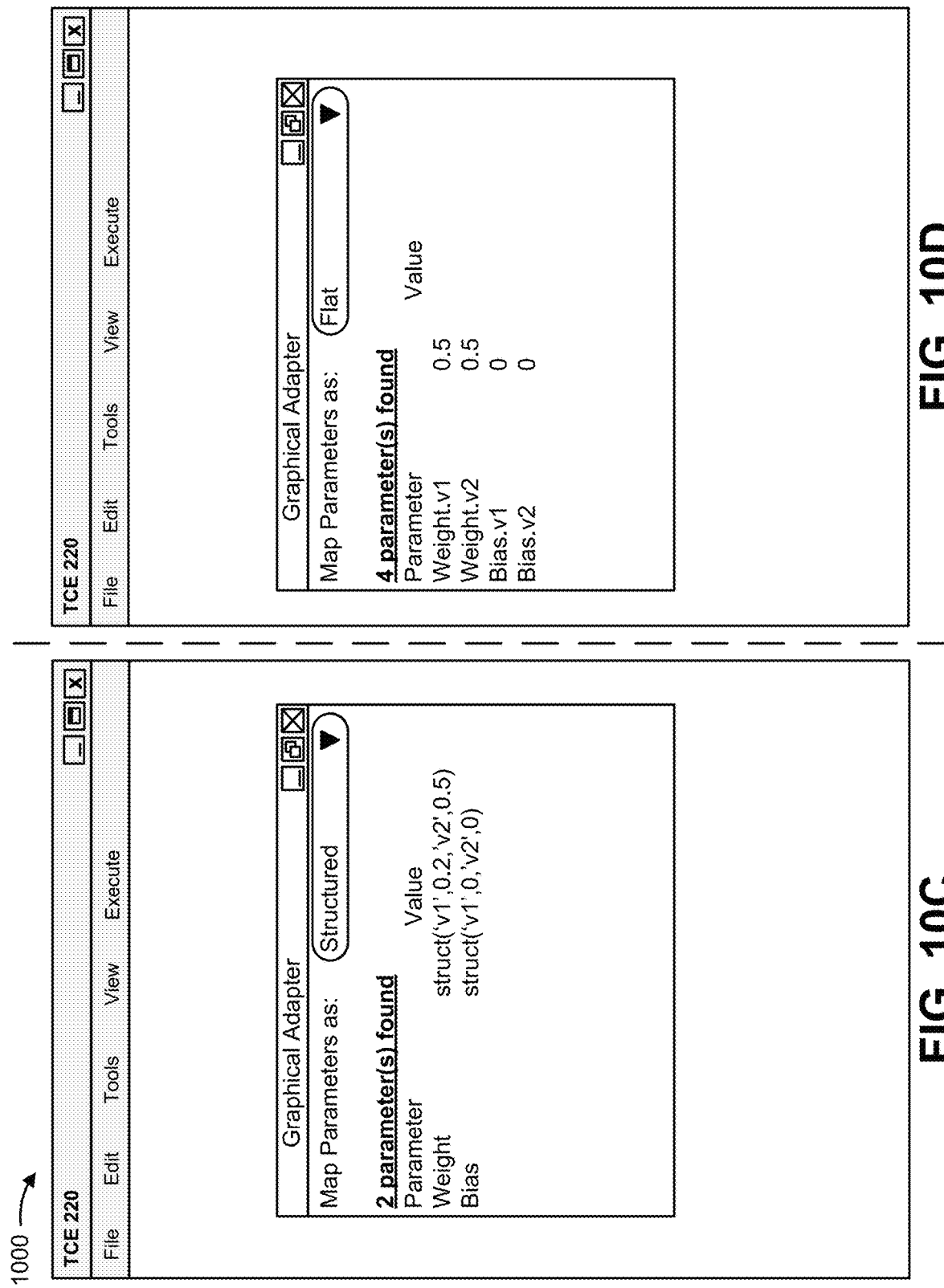

As shown in FIG. 10A, client device 210 may provide, via TCE 220, a presentation of program code representing a model. The program code may include portions of program code associated with representing portions of the model (e.g., ports, connectors, variables, etc.). As shown in FIG. 10B, the model may include a set of model blocks, such as one or more buses, selectors, or the like. Client device 210 may generate an interface adapter to adapt signals, parameters, states, or the like of the model and/or the program code. For example, as shown in FIG. 10C, client device 210 may provide information regarding parameters of the model in a structured manner, and may provide information regarding two parameters Weight and Bias with respective values struct('v1',0.2, 'v2',0.5) and struct('v1',0,'v2',0). A user interaction, detected by client device 210, may cause client device 210 to change from providing information regarding the parameters of the model in the structured manner to providing information regarding parameters of the model in a flat manner. In this case, client device 210 may provide, for display, information regarding four parameters (e.g., corresponding to the two parameters) Weight.v1, Weight.v2, Bias.v1, and Bias.v2. The four parameters may be associated with respective values of 0.5, 0.5, 0, 0, corresponding to values of the two parameters.

In this manner, client device 210 provides textual information corresponding to different presentations of a model (e.g., a structured presentation using structure variables and a non-structured presentation using non-structure variables). Moreover, client device 210 may permit a user to provide and/or view information in a first format (e.g., flat) for a model element that utilizes the information in a second format (e.g., structured). In some implementations, the textual information may differ from a graphical presentation of the model. For example, the model may utilize a structured presentation of Weight and Bias and the textual information may be presented in a flat, non-structured presentation.

As indicated above, FIGS. 10A-10D are provided merely as an example. Other examples are possible and may differ from what was described with regard to FIGS. 10A-10D.

FIG. 11 is a diagram of an example implementation 1100 of interface adaptation.

As shown in FIG. 11, and by reference number 1110, client device 210 (e.g., TCE 200) may provide, for display, a design specification document that is associated with describing a portion of a model element (e.g., TopBus that includes a set of elements A; B, which includes Q and R; and C, which includes S and T). In some implementations, the design specification document may correspond to a portion of the model shown in FIGS. 8A-8D. As shown by reference number 1120, client device 210 may receive code associated with constructing TopBus. As shown by reference number 1130, a set of signals are specified for identifiers A, Q, and R. As shown by reference number 1140, virtual bus is specified for B based on a map of signals Q and R. As shown by reference number 1150, a non-virtual bus is specified for C based on a bus object. As shown by reference number 1160, non-virtual bus C is included in virtual bus TopBus. Based on the received code, client device 210 may automatically generate a port expansion layer with three graphical ports. The first port may be a scalar representing signal A. The second port may be a virtual bus (tie wrap) that includes a first port and a second port representing signals Q and R respectively. The third port may be a non-virtual bus associated with receiving a structure (e.g., that includes signals S and T). In this way, an interface adapter may be constructed based on a user specification for a referenced model.

As indicated above, FIG. 11 is provided merely as an example. Other examples are possible and may differ from what was described with regard to FIG. 11.

The foregoing disclosure provides illustration and description, but is not intended to be exhaustive or to limit the implementations to the precise form disclosed. Modifications and variations are possible in light of the above disclosure or may be acquired from practice of the implementations.

The term program code is to be broadly interpreted to include text-based code that may be automatically executed (e.g., C code, C++ code, Hardware Description Language (HDL) code, very-high-speed integrated circuits (VHSIC) HDL (VHDL) code, Verilog, Java, and/or other types of hardware or software based code that may be compiled and/or synthesized); text files that may be executed in conjunction with other executables. In one example, program code may include different combinations of the above-identified classes (e.g., text-based code, binary code, text files, etc.). Alternatively, or additionally, program code may be of any type, such as function, script, object, etc., and a portion of program code may include one or more characters, lines, etc. of the program code.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
    identifying a first model element and a second model element within a model as being non-interoperable, wherein:
        being non-interoperable comprises: an attribute of the first model element being incompatible with an attribute of the second model element, where an attribute of a model element comprises a parameter, a signal, a communications requirement, or a graphical interface of a model element, and
        the identifying comprises: mapping attributes of the first and second model elements to identify incompatible attributes of the elements;
    generating an adaptation between the first and second model elements, the generating comprising: generating a layer that allows communication or compatible connection between the incompatible attributes or altering the incompatible attributes to make them compatible; and
    simulating the model using the adaptation, or
    generating code for the model using the adaptation, by one or more processors, and executing the generated code.

2. The method of claim 1, wherein the communications requirement being incompatible comprises at least one of: a temporal difference, a spatial difference, a structural difference, a complexity difference, a domain difference, a connection difference, or an execution difference.

3. The method of claim 2, wherein the communications requirement being incompatible comprises at least one of: the temporal difference comprising a sample time difference; the spatial difference comprising a fixed point representation difference, or a floating point representation difference; the spatial difference comprising: a fixed point representation difference, or a floating point representation difference; the structural difference comprising an aggregation of elements difference; the complexity difference comprising a real part and imaginary part difference; the domain difference comprising whether a port represents a causal relation, or a non-causal relation; the connection difference comprising a difference relating to at least one of: equality, assignment, production or consumption; or the execution difference comprising a difference relating to at least one of: a discrete time execution, a discrete event execution, a continuous time execution, a blocking execution, or a non-blocking execution.

4. The method of claim 1, wherein:
the signal comprises a value that has a data type and/or a dimension, complexity, sample time,
the parameter comprises a value that has a data type and/or a dimension, complexity, sample time, and
being incompatible comprises any of the data type, dimension, complexity, sample time being incompatible.

5. The method of claim 1, wherein the graphical interface being incompatible comprises having at least one of different: iconography, port layouts, geometric shapes, sizes, colors, annotations, shading, or badges.

6. The method of claim 1, wherein the layer comprises at least one of:
one or more components, a subsystem, an adaptation layer, or an expansion layer.

7. A computer-readable medium storing instructions, the instructions comprising one or more instructions that, when executed by at least one of one or more processors, cause one or more of the one or more processors to:
identify a first model element and a second model element within a model as being non-interoperable, wherein:
being non-interoperable comprises: an attribute of the first model element being incompatible with an attribute of the second model element, where an attribute of a model element comprises a parameter, a signal, a communications requirement, or a graphical interface of a model element, and
the identifying comprises: mapping attributes of the first and second model elements to identify incompatible attributes of the elements;
generate an adaptation between the first and second model elements, the generating comprising: generating a layer that allows communication or compatible connection between the incompatible attributes or altering the incompatible attributes to make them compatible; and
simulate the model using the adaptation, or generate code for the model using the adaptation and execute the generated code.

8. The computer-readable medium of claim 7, wherein the communications requirement being incompatible comprises at least one of: a temporal difference, a spatial difference, a structural difference, a complexity difference, a domain difference, a connection difference, or an execution difference.

9. The computer-readable medium of claim 8, wherein the communications requirement being incompatible comprises at least one of: the temporal difference comprising a sample time difference; the spatial difference comprising a fixed point representation difference, or a floating point representation difference; the spatial difference comprising: a fixed point representation difference, or a floating point representation difference; the structural difference comprising an aggregation of elements difference; the complexity difference comprising a real part and imaginary part difference; the domain difference comprising whether a port represents a causal relation, or a non-causal relation; the connection difference comprising a difference relating to at least one of:
equality, assignment, production or consumption; or the execution difference comprising a difference relating to at least one of: a discrete time execution, a discrete event execution, a continuous time execution, a blocking execution, or a non-blocking execution.

10. The computer-readable medium of claim 7, wherein:
the signal comprises a value that has a data type and/or a dimension, complexity, sample time,
the parameter comprises a value that has a data type and/or a dimension, complexity, sample time, and
being incompatible comprises any of the data type, dimension, complexity, sample time being incompatible.

11. The computer-readable medium of claim 7, wherein the graphical interface being incompatible comprises having at least one of different: iconography, port layouts, geometric shapes, sizes, colors, annotations, shading, or badges.

12. The computer-readable medium of claim 7, wherein the layer comprises at least one of: one or more components, a subsystem, an adaptation layer, or an expansion layer.

13. A device, comprising:
one or more processors configured to:
identify a first model element and a second model element within a model as being non-interoperable, wherein:
being non-interoperable comprises: an attribute of the first model element being incompatible with an attribute of the second model element, where an attribute of a model element comprises a parameter, a signal, a communications requirement, or a graphical interface of a model element, and
the identifying comprises: mapping attributes of the first and second model elements to identify incompatible attributes of the elements;
generate an adaptation between the first and second model elements, the generating comprising: generating a layer that allows communication or compatible connection between the incompatible attributes or altering the incompatible attributes to make them compatible; and
simulate the model using the adaptation, or generate code for the model using the adaptation and execute the generated code.

14. The device of claim 13, wherein the communications requirement being incompatible comprises at least one of: a temporal difference, a spatial difference, a structural difference, a complexity difference, a domain difference, a connection difference, or an execution difference.

15. The device of claim 14, wherein the communications requirement being incompatible comprises at least one of:
the temporal difference comprising a sample time difference; the spatial difference comprising a fixed point representation difference, or a floating point representation difference; the spatial difference comprising: a fixed point representation difference, or a floating point representation difference; the structural difference comprising an aggregation of elements difference; the complexity difference comprising a real part and imaginary part difference; the domain difference comprising whether a port represents a causal relation, or a non-causal relation; the connection difference comprising a difference relating to at least one of: equality, assignment, production or consumption; or the execution difference comprising a difference relating to at least one of: a discrete time execution, a discrete event execution, a continuous time execution, a blocking execution, or a non-blocking execution.

16. The device of claim 13, wherein:
the signal comprises a value that has a data type and/or a dimension, complexity, sample time,
the parameter comprises a value that has a data type and/or a dimension, complexity, sample time, and
being incompatible comprises any of the data type, dimension, complexity, sample time being incompatible.

17. The device of claim 13, wherein the graphical interface being incompatible comprises having at least one of different: iconography, port layouts, geometric shapes, sizes, colors, annotations, shading, or badges.

18. The device of claim 13, wherein the layer comprises at least one of:
one or more components, a subsystem, an adaptation layer, or an expansion layer.

19. A method, comprising:
generating, by one or more processors, code for a model that comprises a first model element and a second model element that are non-interoperable, wherein:
being non-interoperable comprises: an attribute of the first model element being incompatible with an attribute of the second model element, where an attribute of a model element comprises a parameter, a signal, a communication requirement, or a graphical interface of a model element, and
the generating comprises generating code for an adaptation between the first and second model elements, the generating code for the adaptation comprising: analyzing the model to determine that the first model element is associated with the second model element, and generating code for a layer that allows communication or compatible connection between the incompatible attributes of the model elements or generating code for one or more altered attributes of one of the model elements, where the one or more altered attributes are compatible with corresponding attributes of the other one of the model elements, and
executing, by the one or more processors or another one or more processors, the generated code.

20. The method of claim 19, wherein the communications requirement being incompatible comprises at least one of: a temporal difference, a spatial difference, a structural difference, a complexity difference, a domain difference, a connection difference, or an execution difference.

21. The method of claim 20, wherein the communications requirement being incompatible comprises at least one of: the temporal difference comprising a sample time difference; the spatial difference comprising a fixed point representation difference, or a floating point representation difference; the spatial difference comprising: a fixed point representation difference, or a floating point representation difference; the structural difference comprising an aggregation of elements difference; the complexity difference comprising a real part and imaginary part difference; the domain difference comprising whether a port represents a causal relation, or a non-causal relation; the connection difference comprising a difference relating to at least one of: equality, assignment, production or consumption; or the execution difference comprising a difference relating to at least one of: a discrete time execution, a discrete event execution, a continuous time execution, a blocking execution, or a non-blocking execution.

22. The method of claim 19, wherein:
the signal comprises a value that has a data type and/or a dimension, complexity, sample time,
the parameter comprises a value that has a data type and/or a dimension, complexity, sample time, and
being incompatible comprises any of the data type, dimension, complexity, sample time being incompatible.

23. The method of claim 19, wherein the graphical interface being incompatible comprises having at least one of different: iconography, port layouts, geometric shapes, sizes, colors, annotations, shading, or badges.

24. The method of claim 19, wherein the layer comprises at least one of:
one or more components, a subsystem, an adaptation layer, or an expansion layer.

25. A computer-readable medium storing instructions, the instructions comprising one or more instructions that, when executed by at least one of one or more processors, cause one or more of the one or more processors to:
generate code for a model that comprises a first model element and a second model element that are non-interoperable, wherein:
being non-interoperable comprises: an attribute of the first model element being incompatible with an attribute of the second model element, where an attribute of a model element comprises a parameter, a signal, a communication requirement, or a graphical interface of a model element, and
the generating comprises generating code for an adaptation between the first and second model elements, the generating code for the adaptation comprising: analyzing the model to determine that the first model element is associated with the second model element, and generating code for a layer that allows communication or compatible connection between the incompatible attributes of the model elements or generating code for one or more altered attributes of one of the model elements, where the one or more altered attributes are compatible with corresponding attributes of the other one of the model elements, and
execute the generated code.

26. The computer-readable medium of claim 25, wherein the communications requirement being incompatible comprises at least one of: a temporal difference, a spatial difference, a structural difference, a complexity difference, a domain difference, a connection difference, or an execution difference.

27. The computer-readable medium of claim 26, wherein the communications requirement being incompatible comprises at least one of: the temporal difference comprising a sample time difference; the spatial difference comprising a fixed point representation difference, or a floating point representation difference; the spatial difference comprising: a fixed point representation difference, or a floating point representation difference; the structural difference comprising an aggregation of elements difference; the complexity difference comprising a real part and imaginary part difference; the domain difference comprising whether a port represents a causal relation, or a non-causal relation; the connection difference comprising a difference relating to at least one of: equality, assignment, production or consumption; or the execution difference comprising a difference relating to at least one of: a discrete time execution, a discrete event execution, a continuous time execution, a blocking execution, or a non-blocking execution.

28. The computer-readable medium of claim 25, wherein:
the signal comprises a value that has a data type and/or a dimension, complexity, sample time,
the parameter comprises a value that has a data type and/or a dimension, complexity, sample time, and
being incompatible comprises any of the data type, dimension, complexity, sample time being incompatible.

29. The computer-readable medium of claim 25, wherein the graphical interface being incompatible comprises having at least one of different: iconography, port layouts, geometric shapes, sizes, colors, annotations, shading, or badges.

30. The computer-readable medium of claim 25, wherein the layer comprises at least one of: one or more components, a subsystem, an adaptation layer, or an expansion layer.

31. A system, comprising:
one or more processors including at least one processor configured to generate code for a model that comprises a first model element and a second model element that are non-interoperable, and at least one processor configured to execute the generated code, wherein:
being non-interoperable comprises: an attribute of the first model element being incompatible with an attribute of the second model element, where an attribute of a model element comprises a parameter, a signal, a communication requirement, or a graphical interface of a model element, and
the generating code comprises generating code for an adaptation between the first and second model elements, the generating code for the adaptation comprising: analyzing the model to determine that the first model element is associated with the second model element, and generating code for a layer that allows communication or compatible connection between the incompatible attributes of the model elements or generating code for one or more altered attributes of one of the model elements, where the one or more altered attributes are compatible with corresponding attributes of the other one of the model elements.

32. The system of claim 31, wherein the communications requirement being incompatible comprises at least one of: a temporal difference, a spatial difference, a structural difference, a complexity difference, a domain difference, a connection difference, or an execution difference.

33. The system of claim 32, wherein the communications requirement being incompatible comprises at least one of: the temporal difference comprising a sample time difference; the spatial difference comprising a fixed point representation difference, or a floating point representation difference; the spatial difference comprising: a fixed point representation difference, or a floating point representation difference; the structural difference comprising an aggregation of elements difference; the complexity difference comprising a real part and imaginary part difference; the domain difference comprising whether a port represents a causal relation, or a non-causal relation; the connection difference comprising a difference relating to at least one of: equality, assignment, production or consumption; or the execution difference comprising a difference relating to at least one of: a discrete time execution, a discrete event execution, a continuous time execution, a blocking execution, or a non-blocking execution.

34. The system of claim 31, wherein:
the signal comprises a value that has a data type and/or a dimension, complexity, sample time,
the parameter comprises a value that has a data type and/or a dimension, complexity, sample time, and
being incompatible comprises any of the data type, dimension, complexity, sample time being incompatible.

35. The system of claim 31, wherein the graphical interface being incompatible comprises having at least one of different: iconography, port layouts, geometric shapes, sizes, colors, annotations, shading, or badges.

36. The system of claim 31, wherein the layer comprises at least one of: one or more components, a subsystem, an adaptation layer, or an expansion layer.

37. The method of claim 1, wherein mapping attributes of the first and second model elements to identify incompatible attributes of the elements is based on at least one of: a threshold matching condition applied to the attributes of the first and second model elements, or a graphical or alphabetical ordering associated with the attributes of the first and second model elements.

38. The computer-readable medium of claim 7, wherein mapping attributes of the first and second model elements to identify incompatible attributes of the elements is based on at least one of: a threshold matching condition applied to the attributes of the first and second model elements, or a graphical or alphabetical ordering associated with the attributes of the first and second model elements.

39. The device of claim 13, wherein mapping attributes of the first and second model elements to identify incompatible attributes of the elements is based on at least one of: a threshold matching condition applied to the attributes of the first and second model elements, or a graphical or alphabetical ordering associated with the attributes of the first and second model elements.

40. The method of claim 19, wherein analyzing the model to determine that the first model element is associated with the second model element comprises determining a mapping between attributes of the first and second model elements based on at least one of: a threshold matching condition applied to the attributes of the first and second model elements, or a graphical or alphabetical ordering associated with the attributes of the first and second model elements.

41. The computer-readable medium of claim 25, wherein analyzing the model to determine that the first model element is associated with the second model element comprises determining a mapping between attributes of the first and second model elements based on at least one of: a threshold matching condition applied to the attributes of the first and second model elements, or a graphical or alphabetical ordering associated with the attributes of the first and second model elements.

42. The system of claim 31, wherein analyzing the model to determine that the first model element is associated with the second model element comprises determining a mapping between attributes of the first and second model elements based on at least one of: a threshold matching condition applied to the attributes of the first and second model elements, or a graphical or alphabetical ordering associated with the attributes of the first and second model elements.

43. The method of claim 1, wherein the adaptation is associated with performing an adaptation service for at least one of:
a plurality of connected graphical blocks,
a graphical block and an executable,
a graphical block and a textual block,
a plurality of hierarchically connected components, one or more functional mock-up interface components,
one or more functional mock-up unit components,
a differential algebraic equation,
an algebraic equation, or
data conversion among parameters for different types of data including at least one of: vector-type data, matrix-type data, or array-type data.

44. The method of claim 1, wherein generating the adaptation comprises at least one of:
mapping a set of parameters of a particular component to a parameter of a parent system, wherein the mapping comprises
mapping a plurality of parameters of a child subsystem into a structure parameter of a parent system, or
adapting a set of scalar parameters into a set of structures to utilize an extensible markup language file for the model.

45. The computer-readable medium of claim 7, wherein the adaptation is associated with performing an adaptation service for at least one of:
a plurality of connected graphical blocks,
a graphical block and an executable,
a graphical block and a textual block,
a plurality of hierarchically connected components,
one or more functional mock-up interface components,
one or more functional mock-up unit components,
a differential algebraic equation,
an algebraic equation, or
data conversion among parameters for different types of data including at least one of: vector-type data, matrix-type data, or array-type data.

46. The computer-readable medium of claim 7, wherein generating the adaptation comprises at least one of:
mapping a set of parameters of a particular component to a parameter of a parent system, wherein the mapping comprises
mapping a plurality of parameters of a child subsystem into a structure parameter of a parent system, or
adapting a set of scalar parameters into a set of structures to utilize an extensible markup language file for the model.

47. The device of claim 13, wherein the adaptation is associated with performing an adaptation service for at least one of:
a plurality of connected graphical blocks,
a graphical block and an executable,
a graphical block and a textual block,
a plurality of hierarchically connected components,
one or more functional mock-up interface components,
one or more functional mock-up unit components,
a differential algebraic equation,
an algebraic equation, or
data conversion among parameters for different types of data including at least one of: vector-type data, matrix-type data, or array-type data.

48. The device of claim 13, wherein generating the adaptation comprises at least one of:
mapping a set of parameters of a particular component to a parameter of a parent system, wherein the mapping comprises
mapping a plurality of parameters of a child subsystem into a structure parameter of a parent system, or
adapting a set of scalar parameters into a set of structures to utilize an extensible markup language file for the model.

49. The method of claim 19, wherein the adaptation is associated with performing an adaptation service for at least one of:
a plurality of connected graphical blocks,
a graphical block and an executable,
a graphical block and a textual block,
a plurality of hierarchically connected components,
one or more functional mock-up interface components,
one or more functional mock-up unit components,
a differential algebraic equation,
an algebraic equation, or
data conversion among parameters for different types of data including at least one of: vector-type data, matrix-type data, or array-type data.

50. The method of claim 19, wherein generating code for the adaptation comprises: generating code for:
mapping a set of parameters of a particular component to a parameter of a parent system, wherein the mapping comprises
mapping a plurality of parameters of a child subsystem into a structure parameter of a parent system, or
adapting a set of scalar parameters into a set of structures to utilize an extensible markup language file for the model.

51. The computer-readable medium of claim 25, wherein the adaptation is associated with performing an adaptation service for at least one of:
a plurality of connected graphical blocks,
a graphical block and an executable,
a graphical block and a textual block,
a plurality of hierarchically connected components,
one or more functional mock-up interface components,
one or more functional mock-up unit components,
a differential algebraic equation,
an algebraic equation, or
data conversion among parameters for different types of data including at least one of: vector-type data, matrix-type data, or array-type data.

52. The computer-readable medium of claim 25, wherein generating code for the adaptation comprises generating code for:
mapping a set of parameters of a particular component to a parameter of a parent system, wherein the mapping comprises
mapping a plurality of parameters of a child subsystem into a structure parameter of a parent system, or
adapting a set of scalar parameters into a set of structures to utilize an extensible markup language file for the model.

53. The system of claim 31, wherein the adaptation is associated with performing an adaptation service for at least one of:
a plurality of connected graphical blocks,
a graphical block and an executable,
a graphical block and a textual block,
a plurality of hierarchically connected components,
one or more functional mock-up interface components,
one or more functional mock-up unit components,
a differential algebraic equation,
an algebraic equation, or
data conversion among parameters for different types of data including at least one of: vector-type data, matrix-type data, or array-type data.

54. The system of claim 31, wherein generating code for the adaptation comprises generating code for at least one of:
   mapping a set of parameters of a particular component to a parameter of a parent system, wherein the mapping comprises
   mapping a plurality of parameters of a child subsystem into a structure parameter of a parent system, or
   adapting a set of scalar parameters into a set of structures to utilize an extensible markup language file for the model.

* * * * *